United States Patent [19]

Troutman et al.

[11] 4,128,773

[45] Dec. 5, 1978

[54] VOLATILE/NON-VOLATILE LOGIC LATCH CIRCUIT

[75] Inventors: Bruce L. Troutman, Irvine; Lawrence S. Schmitz, Costa Mesa, both of Calif.

[73] Assignee: Hughes Aircraft Company, Culver City, Calif.

[21] Appl. No.: 848,854

[22] Filed: Nov. 7, 1977

[51] Int. Cl.$^2$ .............................................. G11C 11/40
[52] U.S. Cl. ...................... 307/238; 307/200 B; 307/279; 307/288; 365/156; 365/184; 365/185; 365/228
[58] Field of Search ............... 307/238, 279, 288, 291, 307/200 B; 356/154, 156, 181, 184, 185

[56] References Cited

U.S. PATENT DOCUMENTS

| | | | |
|---|---|---|---|
| 3,774,087 | 11/1973 | Pepper | 307/238 X |
| 3,831,155 | 8/1974 | Tamaru et al. | 307/279 X |
| 3,836,894 | 9/1974 | Cricchi | 307/238 X |
| 3,845,327 | 10/1974 | Cricchi | 307/238 |
| 4,004,159 | 1/1977 | Rai et al. | 307/238 |
| 4,016,588 | 4/1977 | Ohya et al. | 307/238 X |
| 4,019,197 | 4/1977 | Lohstroh et al. | 365/185 X |
| 4,030,081 | 6/1977 | Horninger | 307/238 X |
| 4,037,242 | 7/1977 | Gosney | 365/185 X |
| 4,044,343 | 8/1977 | Uchida | 307/279 X |
| 4,070,655 | 1/1978 | Schürmeyer et al. | 365/184 X |

*Primary Examiner*—Larry N. Anagnos

*Attorney, Agent, or Firm*—W. H. MacAllister; Joseph E. Szabo

[57] ABSTRACT

There is described a logic element employing fixed threshold and variable threshold transistors electrically connected together to form a latch. The latch can be made to retain data by keeping certain internal nodes at a high or low voltage level. As such, it acts as an ordinary volatile semiconductor memory latch, whose data can be changed by externally overriding the internal voltage levels of the latch cell. Non-volatile storage capability is achieved by replacing one or several of the transistors in the latch by specially constructed transistors, whose threshold voltage can be raised or lowered upon application of a relatively high voltage pulse between their gate and substrate. By application of such a high voltage pulse, the data stored in the latch can be translated into controlled threshold shifts of the variable threshold transistors, which uniquely represent the initial latch state. Therefore, if power is removed and then returned, the latch will always settle into a state dictated by the final state that existed in the latch before the high voltage pulse was applied. In this way the variable threshold elements of the latch cell make it a non-volatile memory element. Fixed threshold IG-FETs, connected so as to bypass the variable threshold elements, enable the latch cell to continue to operate even after a variable threshold element has been rendered irreversibly non-conductive by a high voltage pulse.

6 Claims, 30 Drawing Figures

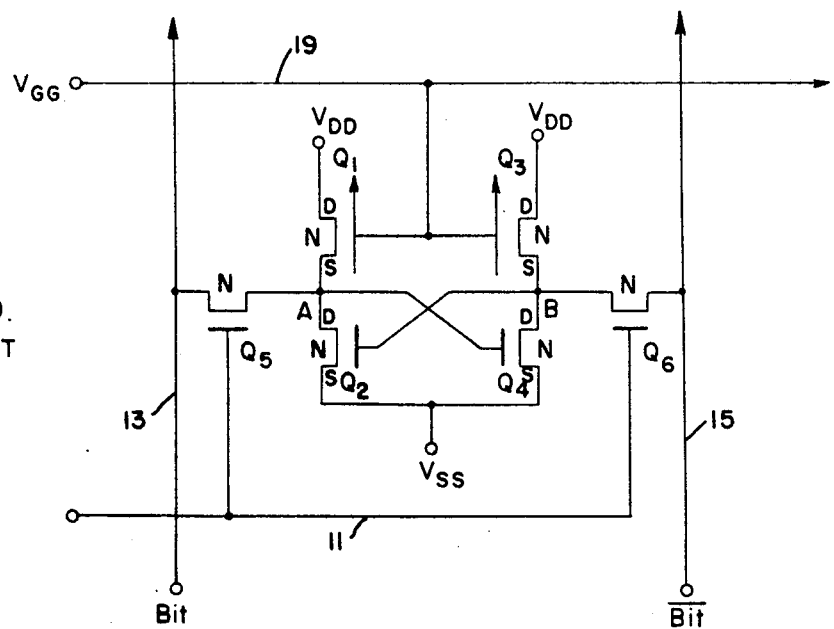
Fig. 1b.
PRIOR ART
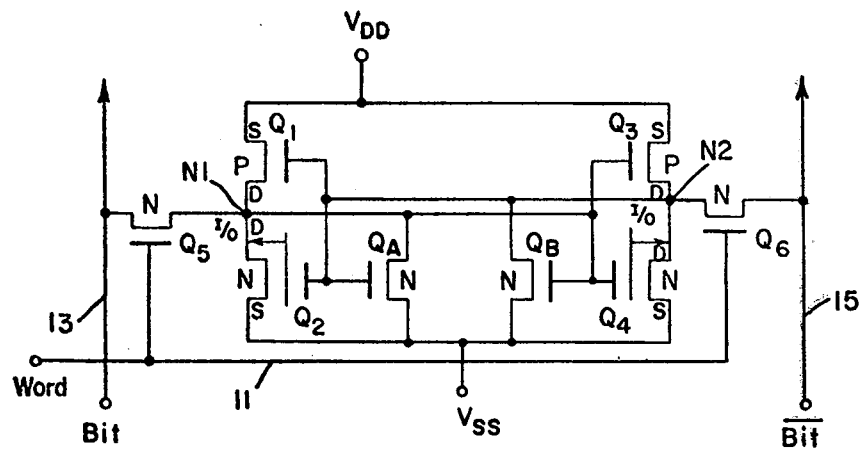
Fig. 2a.
Fig. 2b.
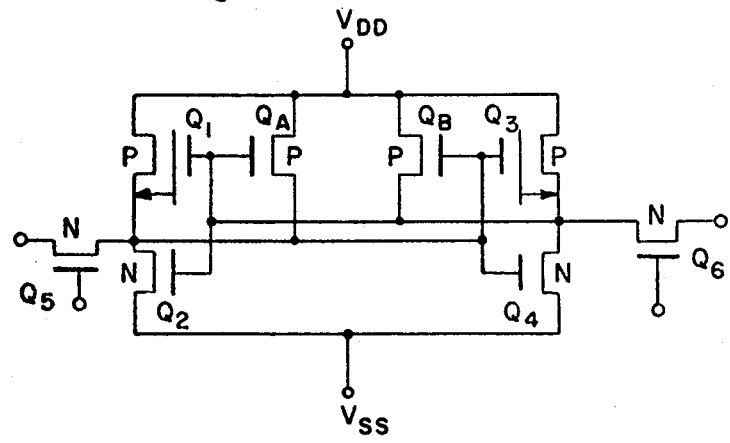

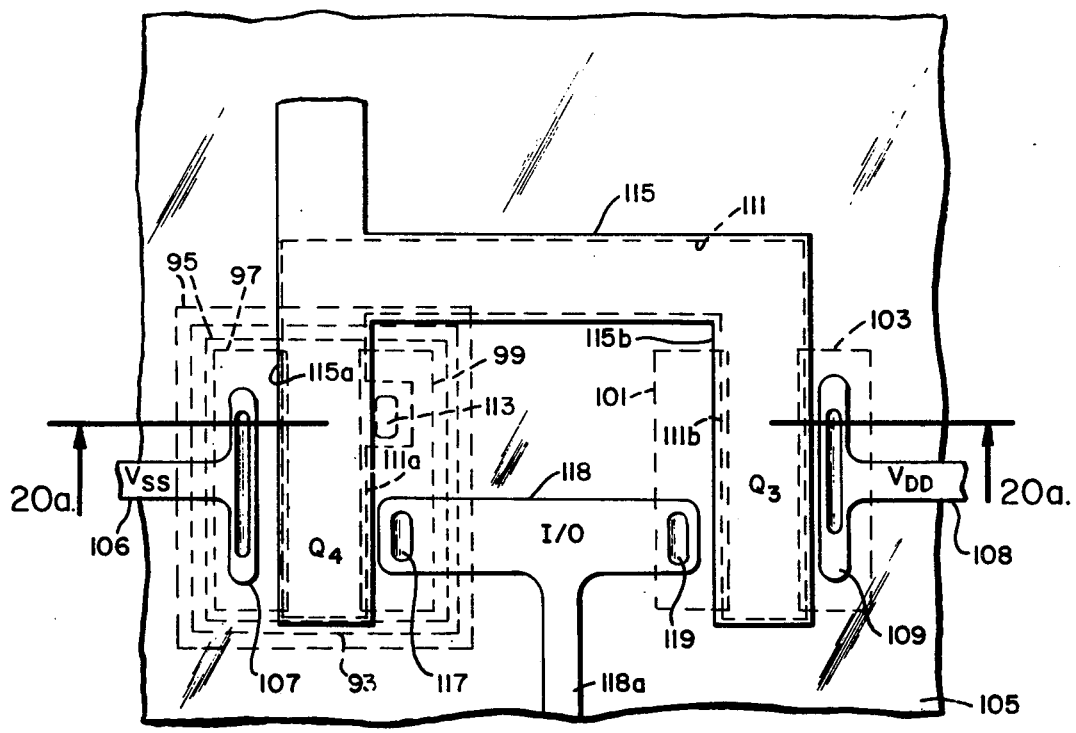
Fig. 19.
Fig. 19a.
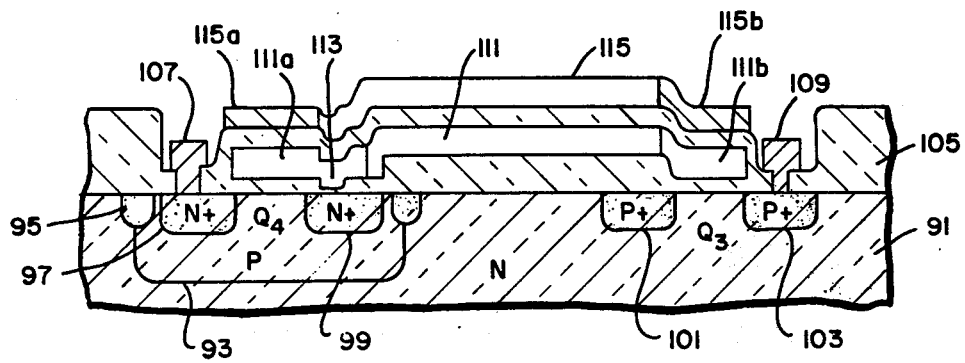

VOLATILE/NON-VOLATILE LOGIC LATCH CIRCUIT

FIELD OF THE INVENTION

This invention relates generally to a semiconductor circuit element which can be used as a non-volatile memory storage cell, and which incorporates several types of MOS transistors having fixed and variable gate threshold voltages.

In an application for U.S. patent, filed by Eliyahou Harari on July 28, 1977, Ser. No. 819,794 and assigned to the assignee of the present invention, there is described and claimed a semiconductor latch circuit which is capable of either volatile or non-volatile information storage.

The objectives of the Harari invention are attained by an integrated semiconductor latch circuit having a pair of branches, each including an insulated gate field effect transistor (IGFET) load and an IGFET driver connected in series, drain-to-drain, at a node. The control gate of the IGFET driver of each branch is cross-connected to the node of the other branch, in order to provide a latch circuit capable of volatile information storage. Non-volatile information storage in accordance with the Harari invention is made possible by making the threshold voltage of at least one of the IGFETs electrically variable, preferably but not necessarily by providing it with a floating gate having a thin oxide area over the node to which the IGFET is connected. An IGFET having such a floating gate shall be referred to as a FATMOS (Floating Gate Thin Oxide Tunneling) transistor and the resulting latch circuit as a NOVRAM (Non-volatile Random Access Memory) latch. A NOVRAM latch in accordance with the Harari invention may have either a pair of variable threshold drivers in combination with a pair of fixed threshold IGFET loads or, alternatively, a pair of fixed threshold IGFET drivers combined with a pair of variable threshold transistor loads. In either case, volatile information storage is accomplished by normally maintaining a supply voltage across both branches which is below that required to change the thresholds of the variable threshold transistors and by turning on one or the other driver so as to set the latch in one of its two stable states. The latch will remain in that state so long as the required supply voltage continues to be applied across its branches.

To permanently store the volatile information in non-volatile form, the supply voltage previously applied across the two branches of the latch is briefly raised to a higher level, which is sufficient to change the thresholds of the variable threshold transistors. This will result in equal but opposite threshold shifts in the two variable threshold transistors so that, if power is removed from the latch after the non-volatile writing operation, the information which had been stored in the latch prior to that operation will be retained in the form of their threshold shifts. When power is next applied to the latch, the branch containing the transistor whose threshold was lowered will turn on first, and will cause the other variable threshold transistor to be turned off, an effect which will be reinforced by the increased threshold level of that other FATMOS transistor.

In some applications a latch as described might have excessive current drain. Basically, such current drain might be due to the fact that during non-volatile writing, when the high voltage pulse is applied to bring about a threshold shift in the variable threshold transistors, one of them may be shifted into a negative threshold state in which the device will conduct even when a zero bias is applied to its control gate (depletion mode operation). Harari eliminates this drawback by adding an additional IGFET, whose threshold remains constant, in series with each of the variable threshold transistors. Consequently, even when a particular variable threshold transistor has its threshold shifted into depletion mode operation, the branch containing it will be prevented from drawing excessive current by the additional constant threshold transistor which will not be biased into conduction at the same time.

Yet another aim described by Harari is to simplify his basic NOVRAM latch circuit by using a variable threshold transistor in only one of its branches to achieve non-volatility, rather than to use one in each branch.

A final objective described by Harari is to improve upon his previously mentioned NOVRAM latch embodiments, wherein the variable threshold transistor is a FATMOS, by extending the floating gate of the variable threshold FATMOS transistor (typically the driver) into the channel region of its associated IGFET load, which in this case will be of the opposite conductivity type. As a result, both the load and the driver will have a variable threshold, which will shift by equal amounts as a result of a nonvolatile (high supply voltage) write operation. Because the load and driver are of opposite conductivity types, the mutually reinforcing effect will be similar to that obtained by using one FATMOS transistor in each branch, but will be achieved by using only a single thin tunneling oxide area. Thus, while this feature of the invention yields the performance advantages of the basic two-FATMOS transistor cell, it does so at a significantly higher yield, since it requires only a single tunneling oxide area per cell.

The present invention is an improvement on the several circuit embodiments disclosed and claimed by Harari in his above-referenced patent application, Ser. No. 819,794. As described previously, the essence of the present invention is to provide an alternate or shunt path around the variable threshold IGFETs of the Harari NOVRAM latches so as to enable them to operate even after the variable threshold IGFETs have been rendered irreversibly non-conductive by a threshold shifting voltage level. What will be described herein are the applications of the present invention to the various embodiments of the Harari NOVRAM latch which were previously described in the above-referenced Harari patent application.

Inherent in the Harari NOVRAM latch is a limitation on the highest permissible level to which the supply voltage may be raised to bring about a threshold shift of the variable threshold transistors and, in combination with such a level, on the maximum time during which the supply voltage may remain at its elevated level. If this inherent voltage-time limit is exceeded, the threshold shifts become so large just prior to power shutdown that the variable threshold transistor whose threshold was increased by the threshold shifting operation becomes incapable of turning on again at normal operating voltages after power has been restored. Consequently, the latch, while truly reflecting its state just prior to power loss, would be permanently locked into that state by the inability of the available operating voltage levels to reach its increased threshold voltage.

It is therefore a principal object of the present invention to enable the Harari NOVRAM latch to continue functioning both as a volatile and as a non-volatile memory cell even after its threshold has been shifted during a non-volatile storage operation, regardless of the extent of such a shift.

A more specific object of the present invention is to permit the Harari NOVRAM latch to operate in the volatile mode regardless of the extent to which its threshold has been shifted, thereby rendering non-critical the level to which its supply voltage is raised and the duration for which such a voltage rise extends.

These and other objects of the invention are attained by providing a fixed threshold IGFET connected so as to bypass each variable threshold IGFET of the Harari NOVRAM latch so that, when a branch having such a variable threshold IGFET becomes irreversibly non-conductive, the circuit remains operable in the volatile mode by virtue of the shunt path provided by the fixed threshold IGFET.

The above objects of the present invention will be described in greater detail by reference to the drawings, in which:

FIG. 1b is a schematic diagram of a prior art latch circuit which is an improvement over that illustrated in FIG. 1a in that it is capable of either volatile or non-volatile information storage;

FIGS. 2a and 2b are alternative forms of a latch circuit made in accordance with the present invention and having FATMOS transistors as their drivers and loads, respectively;

FIG. 3b is the symbol used herein to depict the FATMOS transistor illustrated in FIGS. 3 and 3a;

Figure 14:
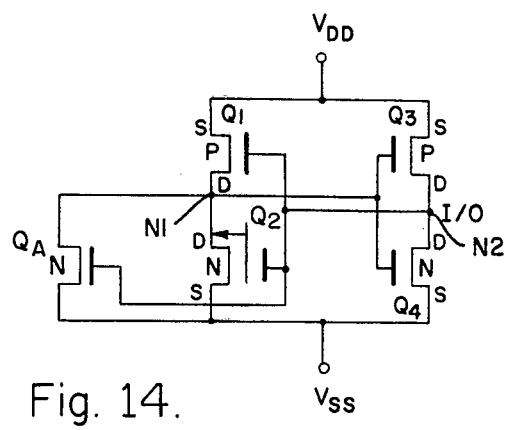
FIG. 14 is a schematic diagram of an improvement on the latch circuit of FIG. 2a wherein only one of the IGFET drivers has a variable threshold voltage.
Figure 18:
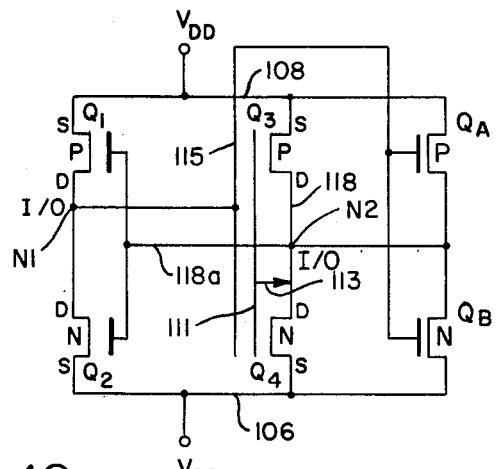
Figure 20:
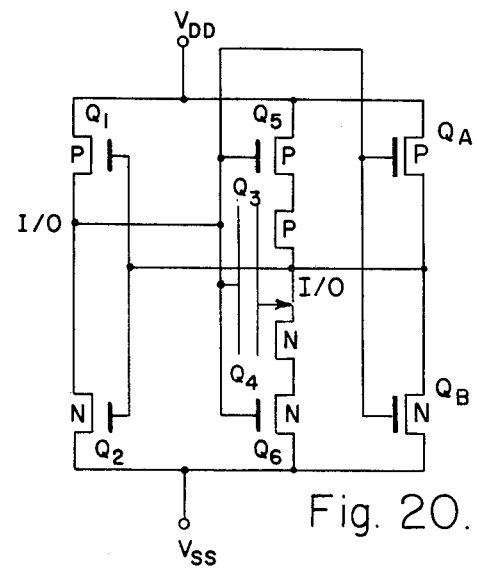

FIG. 18 is a schematic diagram of a NOVRAM latch which like the circuit of FIG. 14 has only a single variable threshold voltage (shown as a FATMOS) transistor but is an improvement thereon in that the floating gate of that transistor extends into the channel area of the IGFET transistor which is in series with the FATMOS transistor so as to provide a pair of variable threshold transistors in the same branch;

FIGS. 19 and 19a are plan and cross-sectional views of a semiconductor chip in which there has been fabricated a FATMOS transistor whose insulated gate extends into the channel area of an adjacent IGFET transistor and which might be used to implement the circuit illustrated schematically in FIG. 18; and FIG. 20 is a schematic diagram of an improved NOVRAM latch circuit similar to that shown schematically in FIG. 18 but with the addition of an IGFET transistor in series with the FATMOS driver and its associated IGFET load so as to limit current in the branch containing those devices.

Figure 1:
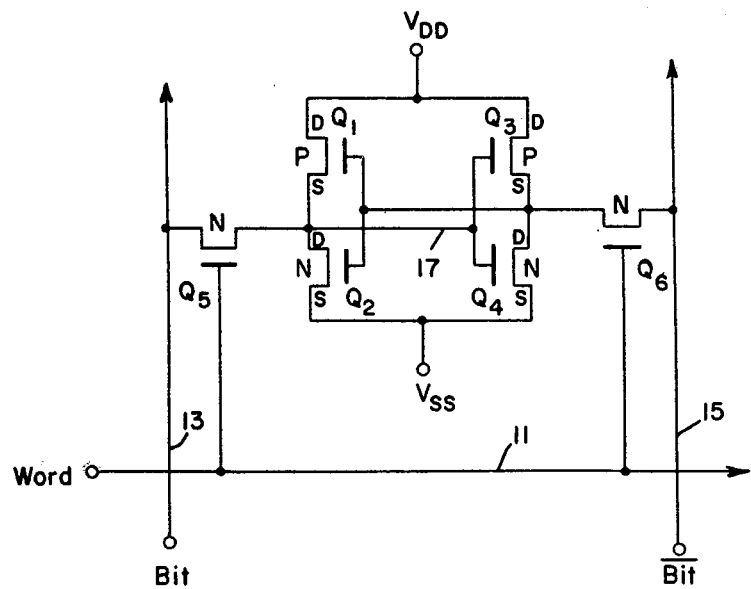
FIGS. 1 and 1a are schematic diagrams of two different types of prior art latch circuits used for volatile information storage.
Figure 1A:
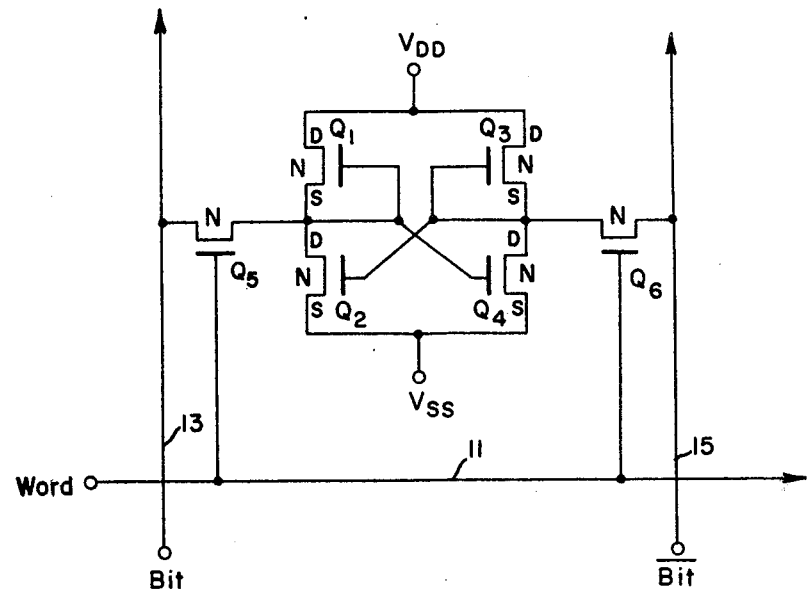

Turning now to the specification, FIGS. 1 and 1a disclose two similar prior art volatile memory latches, both comprising six transistors. The FIG. 1 latch is implemented in CMOS technology in which the latch has two branches, each comprising a CMOS inverter having two opposite conductivity type IGFETs, $Q_1$ and $Q_2$ in one branch, $Q_3$ and $Q_4$ in the other branch. The conductivity types and the sources and drains of the various transistors, $Q_1$ through $Q_6$, are identified by the appropriate initial letters. Typical voltages for $V_{SS}$ and $V_{DD}$ are zero and $+10$ and information is stored in the latch by activating the world line 11 so as to turn on the input transistors $Q_5$ and $Q_6$, both of which are shown as N-channel devices, and by applying a turn on voltage to one or the other of the Bit and $\overline{Bit}$ lines 13 and 15. A suitable convention is to assume that a logic 1 on a given one of the lines 13 and 15 is represented by raising that line to $V_{DD}$ and that a logic 0 on the line is represented by maintaining the line at $V_{SS}$. Of course, whenever one of the lines 13 and 15 is at logic 1 the other one of those lines will be at logic 0. Assuming then that line 15 is at logic 1 and that transistors $Q_5$ and $Q_6$ have been enabled, the gates of $Q_1$ and $Q_2$ will be pulled up to $V_{DD}$, causing $Q_2$ to turn on and $Q_1$ to turn off because of their opposite conductivity types. With $Q_2$ turned on, its drain drops to $V_{SS}$ and, through the cross-coupling connection 17, turns off $Q_4$, while turning on $Q_3$. So long as power is maintained, the state of the latch remains where it has been set, with $Q_2$ and $Q_3$ biased into conduction and $Q_1$ and $Q_4$ being cut off. The steady state current drawn in the latch is minimal, since both branches contain a non-conducting transistor, a feature characteristic of CMOS circuits. The information can be sampled by interrogating the circuit through the transistors $Q_5$ and $Q_6$.

The FIG. 1a circuit is that described in paper 12.5, ISSCC 1976, entitled "A 4K Static 5V RAM" by Schlageter et al. It too comprises six IGFETs, $Q_1$ through $Q_6$, all of which, however, are N-channel devices. Significantly, the load transistor $Q_1$ and $Q_3$ are depletion type N-channel transistors, whereas the driver transistors $Q_2$ and $Q_4$ are enhancement type devices. The depletion load transistors $Q_1$ and $Q_3$ have their gates connected to their sources, rather than to the gates of their respective drivers. As a result, they act as constant current sources to their respective driver transistors. Latching action is accomplished as with the FIG. 1 circuit by cross-coupling the gate of the driver transistor of a given branch to the node at which the load and driver transistors of the other branch are joined. Consequently, application of a given information input signal on the lines 13 and 15 will result in turning on the driver transistor of the same branch, just as it would if it were applied to the FIG. 1 circuit. Greater simplicity of fabrication is the main advantage of the FIG. 1a circuit over that of FIG. 1, since only one conductivity type of device is involved. This, however, is obtained at the cost of greater current consumption, since there will be a finite current drain in one of the branches of the FIG. 1a memory latch at all times.

An improvement over the volatile memory latch circuit of FIG. 1a is illustrated in FIG. 1b. It was previously described in a paper "Memory Cells for N-Channel MNOS Arrays", presented at the Non-Volatile Memory Conference held in Vail, Colorado on August, 1976 by F. Schuermeyer et al. Basically, its operation is the same as that of the FIG. 1a circuit for volatile information storage which is accomplished by applying appropriate signals to the circuit over lines 11, 13 and 15. The improvement which enables the FIG. 1b circuit to store information in non-volatile form is accomplished by using MNOS variable threshold transistors for the transistors $Q_1$ and $Q_3$ in place of the fixed threshold transistors used in the FIG. 1a circuit. Volatile information is stored by setting the flip-flop into one or the other of its stable states in which either $Q_2$ or $Q_4$ conducts. Non-volatile information storage is effected by briefly raising the $V_{GG}$ voltage on the line 19, which will have the effect of shifting the threshold of one of the two MNOS transistors $Q_1$ and $Q_3$, the one being that which is in series with the conducting one of the driver transistors $Q_2$ and $Q_4$. Consequently, when the non-volatile information is subsequently retrieved by reapplying $V_{GG}$ at its lower level to the line 19, the latch will reset itself into its original state for the reasons previously explained.

The shortcomings of the FIG. 1b circuit are described in some detail in the above-referenced Harari patent application. Briefly, they include the need to erase the threshold shift on that particular one of the two transistors $Q_1$ and $Q_3$ affected by the last non-volatile storage operation before information can be again stored in non-volatile form. This erase operation requires a burst of high voltage pulses of critical time duration, which tend to have an adverse effect on the reliability and life of the latch circuit. Furthermore, the FIG. 1b circuit requires an additional power line ($V_{GG}$), which uses up unnecessary space. Because of the necessity to apply high positive and negative voltage pulses to $V_{GG}$, it is difficult to create for the input pad of this line proper protection from spurious high voltage pulses which may cause dielectric breakdown to any of the many load transistors sharing $V_{GG}$ as their gate line.

FIG. 2a illustrates the application of the present invention to one possible embodiment of the Harari NOVRAM latch. Essentially, without the IGFETs $Q_A$ and $Q_B$, whose inclusion represents the crux of the present invention, the FIG. 2a circuit is essentially identical to that illustrated in FIG. 1, except for the important fact that the transistors $Q_2$ and $Q_4$ are variable threshold voltage transistors.

Before getting into a detailed discussion of the improved FIG. 2a circuit, it will be helpful first to review briefly a preferred type of variable threshold voltage transistor for use in latch circuits in accordance with the present invention. One embodiment of such a preferred variable threshold transistor is illustrated in plan and cross-sectional views in FIGS. 3 and 3a and, symbolically, in FIG. 3b. Briefly, it is formed in P-type silicon region 21 which, in a CMOS circuit such as that of FIG. 2, will normally itself be a part of a larger N-type silicon substrate. Such a P-type region is referred to in the art as a "P well". Spaced apart source and drain regions 23 and 25 of opposite conductivity type are formed in the surface of the P well 21 by conventional means, the area between them being the channel 24 over which conduction is selectively established between the source and the drain. A protective insulating layer 26 preferably, but not necessarily an oxide/nitride two layer composite, overlies the entire source-to-drain circuit, with the source and drain being respectively connected to outside circuitry through a pair of metal contacts 27 and 29 which extend to them through the layer 26.

Figure 3:
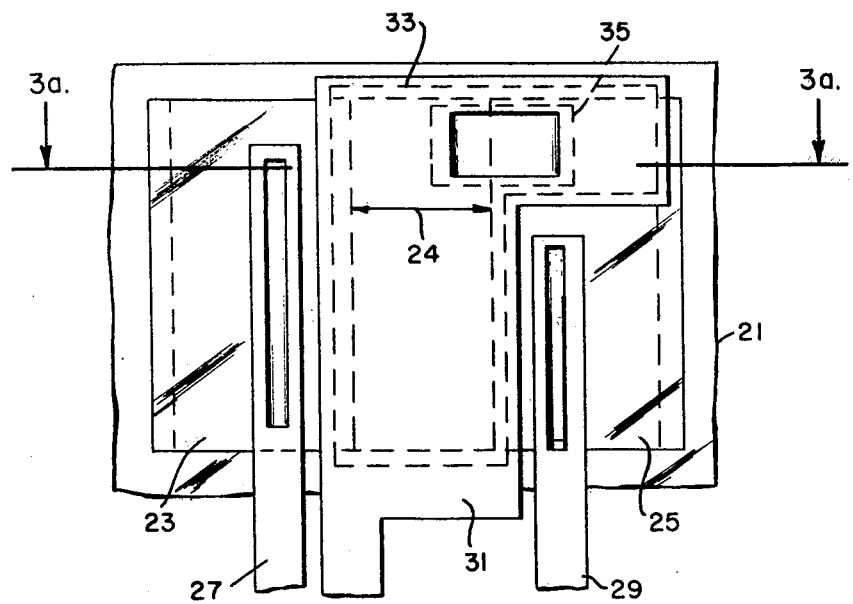
FIGS. 3 and 3a are plan and cross-sectional views of the FATMOS transistor used in the circuits of FIGS. 2a and 2b.

Overlying the insulating layer 26, and covering the entire channel region 24, is a metal control gate 31, whose function is to selectively render the channel region 24 conductive by attracting a layer of electrons in response to the application of a positive supply voltage to the control gate. Interposed between the control gate 31 and the surface of the P well 21 is a second gate 33, which is totally isolated electrically from all other elements by the insulating layer 26 and which, for that reason, is referred to as a "floating gate". A selected area 35 of the floating gate 33 dips closer to the substrate surface so that the thickness of the oxide between the floating gate and the substrate is substantially reduced. This area 37 is designated as the thin tunneling oxide, because it brings the floating gate 33 sufficiently close to the silicon substrate to make possible the use of tunneling as a conduction mechanism for transferring charges between the floating gate 33 and the semiconductor body and, in particular, its drain region 25. It will be understood of course that, if the variable threshold device illustrated in FIGS. 3 and 3a is to be part of an all N-channel circuit, it will be formed in an all P conductivity type substrate directly, and that the comments directed at a P well herein will then apply to that all P conductivity type substrate. Similarly, as will be discussed later, it may be desirable to implement the variable threshold transistor of FIGS. 3 and 3a as a P channel device, in which case it will be formed directly in the N conductivity type semiconductor substrate.

The transistor of FIGS. 3 and 3a is capable of two modes of operation. In its regular mode, its source and drain 23 and 25 are connected to external circuitry, so that one of them is positive relative to the other. The control gate 31 is maintained at either one of two potentials. At the first potential, which may be assumed to be 0 volts relative to the substrate 21, the control gate has no effect on the conductivity of the device which, as a result, is nonconductive in that state. When it is desired to turn the device on, a more positive voltage, typically +5 to +10 volts, is applied to the control gate 31, which induces an inversion layer of electrons to collect in the channel region 24, turning the device on and creating a very low resistance path in the source-to-drain circuit of the device.

To operate the device in its second mode, a significantly higher voltage, typically +15 to +25 volts is applied to its control gate 31 which will be sufficient to induce tunneling between the substrate 21 and the floating gate 33 through the thin oxide region 37. During this brief tunneling episode, charges will move on to the floating gate 33, initially over the thin oxide region 37, but will quickly distribute themselves over the entire floating gate, since it is a good conductor. Typically it will be fabricated from doped polycrystalline silicon, while the control gate 31 will usually be metal, although it too could be doped polycrystalline silicon. The charges thus deposited on the floating gate 33 will be retained on it for extremely long periods of time, on the order of tens of years, because they will have no path through which to escape, the floating gate 33 being totally surrounded by the insulating dielectric layer 26. The effect of a layer of electrons on the floating gate 33 during subsequent operation of the device will be to alter its threshold, since the electrons will have the effect of repelling electrons from the surface of the substrate in its channel region 24, thus increasing the turn-on threshold voltage of the device. To return the device to its original state, the trapped charges may be removed from the floating gate 33 by applying a potential between the control gate 31 and the substrate 21 equal to that used to create the trapped charges, but opposite in polarity. This will cause the trapped charges to tunnel from the floating gate 33 through the thin oxide region 37.

Preferably the portion 35 of the floating gate 33 which defines the thin oxide region 37 occupies a significantly smaller area than that defined by the entire gate. This is a decided advantage over previous floating gate variable threshold devices, because it reduces the area of the thin tunneling oxide 37, which is prone to suffer from pinholes, which in turn might result in the breakdown of the device. While the tunneling oxide area 37 has been shown in FIGS. 3 and 3a to extend over the drain-to-substrate junction and into the channel area 24, it may, as an alternative, be entirely over the drain region 25, and, indeed, this is the most preferred location for the thin oxide region 37, as shown in FIG. 4. Stating it differently, for implementing the NOVRAM latch circuits with which the present invention is used, FATMOS transistors may be used as the variable threshold elements. If they are so used, their tunneling oxide areas 37 must be either entirely over their drains 25 or partially over their drains and channel regions 25 and 24. The thickness of the oxide in the area 37 will typically be in the range of 20 to 100 angstroms. The size of that area should be as small as possible, in order to reduce the effect of pinholes.

Figure 3B:
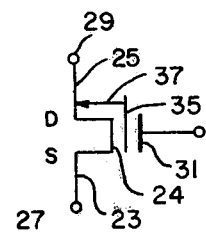
Figure 3A:
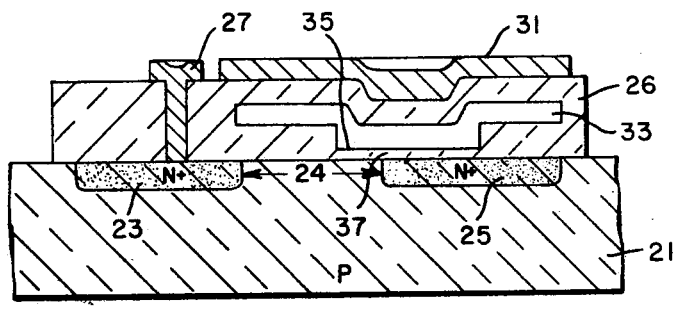
Figure 4:
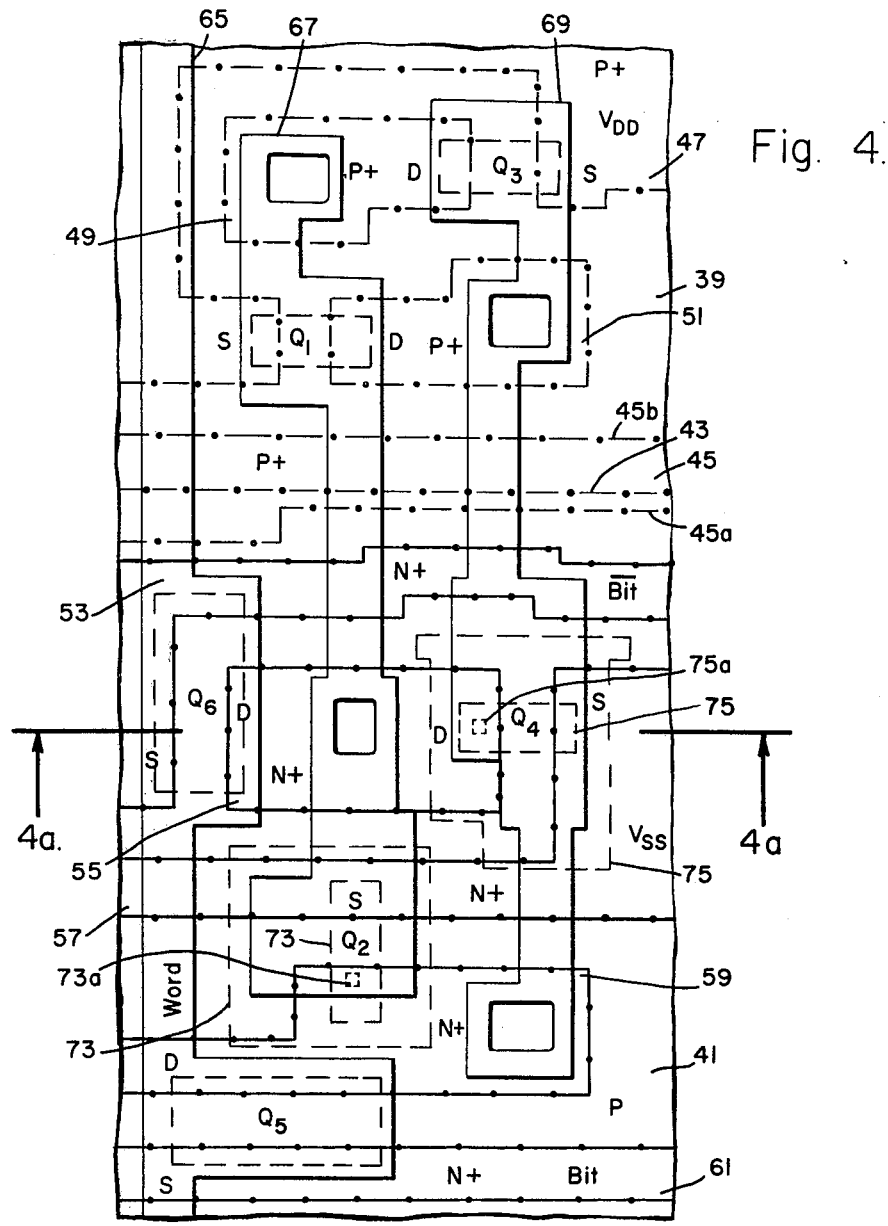
FIGS. 4 and 4a are plan and cross-sectional views of a semiconductor chip portion in which there has been fabricated a circuit of the type illustrated in FIG. 2a but without the additional IGFETs comprising the present invention.

FIG. 3b is the symbol which has been adopted for representing a variable threshold transistor of the FATMOS type which is illustrated in FIGS. 3 and 3a. The symbol includes representations of the source and drain 23 and 25, the thin oxide 37 near the drain 25, the floating gate 35 extending over the channel 24, and the control gate 31 covering at least part of the floating gate 35.

Figure 5:
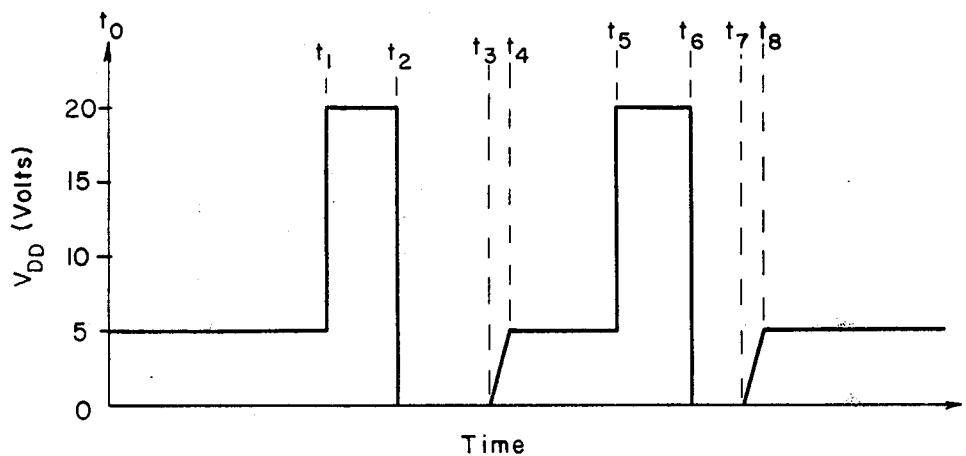
FIG. 5 is a timing diagram illustrating the voltages which are applied across the two branches of the latch circuits illustrated in FIGS. 2a and 2b for volatile and non-volatile storage operation.

Returning now to the FIG. 2a embodiment of the present invention, its operation in the absence of $Q_A$ and $Q_B$ (referred to hereinafter as "the underlying circuit of FIG. 2a", which is the previous invention of E. Harari) will next be described with reference to the timing diagram of FIG. 5. In referring to the circuit, the transistors $Q_2$ and $Q_4$ will be referred to as FATMOS transistors whose symbols indeed are those used for the transistors. It should be understood, however, that the present invention is sufficiently broad to find applicability to other variable threshold transistors as well. Initially, both FATMOS transistors $Q_2$ and $Q_4$ have the same threshold voltage $V_T$, as do the two fixed threshold load transistors $Q_1$ and $Q_3$. The state of the latch circuit is set so as to store either a binary 1 or a binary 0 by enabling the two "word" line transistors $Q_5$ and $Q_6$ and bringing the Bit and $\overline{\text{Bit}}$ lines to 1 and 0 or 0 and 1, respectively. It may be assumed that a logic 0 is represented on a given one of the lines 13 and 15 by applying a $V_{SS}$ voltage level to that line and that a logic 1 level is represented by bringing that line to a $V_{DD}$ voltage level, where $V_{SS}$ is the potential maintained on the sources of the drive transistors $Q_2$ and $Q_4$ and is typically at 0 volts, while the potential $V_{DD}$ is that applied to the sources of the load transistors $Q_1$ and $Q_3$, a level which is typically +5 or +10 volts.

The voltage $V_{DD} - V_{SS}$ across the two branches of the latch is maintained at a level which is sufficient for operation in the volatile storage mode, but is less than that required to cause tunneling in the transistors $Q_2$ and $Q_4$. The latch will be set in the manner explained previously with reference to the prior art circuit of FIG. 1, and once it is set it will remain so, as long as $V_{DD} - V_{SS}$ does not drop below approximately 1.0 volt. Thus, assuming for example that, at some time between $t_0$ and $t_1$, a logic 0 is signaled on the $\overline{\text{Bit}}$ line 15 and a logic 1 on the Bit line 13, the resulting near $V_{DD}$ level at node $N_1$ will turn on the drive transistor $Q_4$, which in turn will shut off the other drive transistor $Q_2$. Because of their gate connections, the transistors $Q_1$ and $Q_3$ will be on and off, respectively. As a result, neither branch of the latch circuit will conduct in its quiescent state. To interrogate the latch circuit for its information, the word line 11 is enabled, turning on the word transistors $Q_5$ and $Q_6$ and permitting the voltage levels of the nodes $N_1$ and $N_2$ to be sensed through them. The state of the latch can be changed at will, by applying a different set of logic state signals to the Bit lines 13 and 15. Since these signals are at a level which is not sufficient to cause permanent threshold voltage change in the variable threshold FATMOS transistors $Q_2$ and $Q_4$, typically not more than 10 volts, the threshold state of the transistors $Q_2$ and $Q_4$ remains unchanged.

When it is desired to permanently store, in non-volatile form the information at the nodes $N_1$ and $N_2$ of the latch, the voltage $V_{DD} - V_{SS}$ across the two branches of the NOVRAM latch is raised to a second level, which is sufficiently high to cause tunneling across the thin oxide areas of the FATMOS transistor drivers $Q_2$ and $Q_4$, causing a change in their threshold voltage. This, of course can be accomplished either by raising $V_{DD}$, or dropping $V_{SS}$, or both. For purposes of this description it will be assumed that the entire voltage change is accomplished by raising $V_{DD}$. Typically, a voltage pulse of +20 volts applied for 10 microseconds will result in a 2 to 3 volt shift in the threshold voltage. As $V_{DD}$ is raised from +10 volts to +20 volts, seen to occur in FIG. 5 between times $t_1$ and $t_2$, the nodes $N_1$ and $N_2$ maintain their previous logic state, with one node remaining at $V_{SS}$ and the other rising to +20 volts. Since both of these voltages are cross-coupled to the control gates of the FATMOS transistors $Q_2$ and $Q_4$, it is apparent that the tunneling field in one of those transistors will be equal in magnitude but opposite in direction to that in the other. Assuming, for example, that, when the non-volatile writing operation was initiated, $Q_4$ was in conduction and $Q_2$ had been cut off, then during the non-volatile writing operation, node $N_2$ will remain at $V_{SS}$ while node $N_1$ will rise with $V_{DD}$ from +10 volts to +20 volts. Consequently, the gate-to-drain voltage on $Q_4$ will rise to +20 volts, while the gate-to-drain voltage across $Q_2$ will also rise, but from −10 volts to −20 volts. And, where the threshold voltage of one of the two transistors $Q_2$ and $Q_4$ has been increased by, let us assume, 2 volts, the threshold voltage of the other one of the transistors will be reduced by an approximately equal amount, so that the two threshold shifts will reinforce each other.

What is important to note is that it is solely the state of the latch circuit, at the time when $V_{DD}$ is raised for non-volatile storage, which dictates which of the transistors $Q_2$ and $Q_4$ shall have a positive threshold shift and which shall have a negative threshold shift. In the case just assumed, it will of course have been the transistor $Q_4$ which was conducting just prior to the non-volatile writing step and whose threshold will be increased. Moreover, unlike the prior art circuit of FIG. 1b, the NOVRAM latch does not require that high voltage pulses of both polarities be applied to it. The +20 volts and −20 volts levels required internally in the latch are derived by it from a single +20 volt supply because of its cross-coupling, which reflects the needed field polarities of its tunneling oxide areas.

As stated before, the threshold voltage shifts of the FATMOS transistors $Q_2$ and $Q_4$ will be permanent over several years at room temperature, but they can be reversed by application of a subsequent pulse, on the order of 20 volts, for approximately 10 microseconds on the $V_{DD}$ line. At the end of the permanent writing pulse, the power on the $V_{DD}$ line can be turned off ($t_2 \rightarrow t_3$) and, when it is switched back on again, the circuit will automatically latch in a distinct state which is dictated by the difference in the threshold voltages caused by the threshold voltage shift during the non-volatile writing operation.

It is apparent from the foregoing description of its operation, that the underlying FIG. 2a circuit will latch into a state which is always opposite that which existed prior to the high voltage or non-volatile writing operation. Thus, where initially $Q_4$ has been in conduction, as assumed hereinabove, when power is returned, beginning in FIG. 5 at time $t_3$ and reached at time $t_4$, it will lag significantly behind $Q_2$ in its tendency to turn on, because the threshold voltage of $Q_4$ was increased, while that of $Q_2$ had been reduced by the high voltage writing operation. In fact, because of this threshold shift, $Q_2$ will turn on first, which will immediately shut off $Q_4$, and this will be the state of the latch for the remainder of the time that $V_{DD}$ continues to be applied to the circuit ($t_4 \rightarrow t_5$). This need not be a problem since, in an array of memory latching circuits or cells, each and every cell would have its state equally inverted. At any rate, the true or non-inverted state can be reinstated simply by repeating the high voltage writing sequence, which is shown to occur between times $t_5$ and $t_6$.

The magnitude and duration of the high voltage pulse on $V_{DD}$ necessary to achieve non-volatile write or erase will generally depend on several parameters of the FATMOS transistor itself. The most important parameter is the thickness of the thin tunneling oxide region 37. Another important parameter is the composition and the thickness of the dielectric between the control gate 31 and the floating gate 33. A further important consideration is the area of overlap between the control gate 31 and the floating gate 33, as well as the area of the tunneling oxide region 33. These affect the ratio of capacitive coupling between the drain 25 and the floating gate 33 on the one hand, and the capacitive coupling between the floating gate 33 and the control gate 31 on the other hand. All of these parameters can be selected at will during processing of the device. Once they have been established by selecting certain processing steps, it will be possible to achieve non-volatile write and erase at any of several voltage levels, there being a possible trade-off between the magnitude of the voltage and its duration. For a given threshold to shift either in the positive or negative direction, it will be necessary to apply a gate-to-drain voltage of between +12 volts and +25 volts. The necessary duration of the voltage will depend on its magnitude, so that typically if a +12 volt pulse has been applied, it will have to be maintained for approximately 10 milliseconds, whereas a 1 microsecond duration will be sufficient to achieve the same threshold shift where the magnitude of the pulse is +25 volts.

The voltage level to be applied in a system will depend to a great extent on the time available to perform a non-volatile write or erase operation. It may also depend on the processing of the memory array, which would operate more reliably at the lower voltage level, that is if only +12 volts or −12 volts were required to achieve non-volatile write or erase, respectively. The probability of short circuits occuring at the lower voltage is far less than if the higher voltage of +25 volts were selected. On the other hand, if the FATMOS transistors $Q_2$ and $Q_4$ were processed so as to sustain a threshold voltage shift even at +12 volts gate-to-drain, this could become a disadvantage during normal volatile read and write operation, since the voltage at which they would have to be carried out would be limited as a result, to avoid unintentional erase. Thus, if for example, non-volatile write were achieved at +15 volts in 1 microsecond, implying a very efficient FATMOS transistor, then if volatile operation were to take place at +10 volts gate-to-drain, the device which responds to +15 volts gate-to-drain by sustaining a threshold voltage shift will respond less efficiently, but still noticeably, to a +10 gate to drain voltage and will initiate erasure of itself in response to the normal operating voltage of +10 volts when it should really not change its threshold voltage at all. In short, in order to avoid ambiguity, the voltage at which threshold shift occurs should be significantly higher than the normal operating voltage in the volatile mode of the inventive latch circuit.

It has been found desirable to keep the $V_T$ difference induced by the high voltage pulsing fairly small, typically 1 volt. By so doing, it becomes possible to override externally (through the Bit and $\overline{\text{Bit}}$ lines 13 and 15), the information stored in the latch by using its push-pull property to overcome the threshold voltage imbalance. Thus, the cell can be used interchangeably, either as a static random access memory (RAM) cell whose information can be changed at the standard 5 or 10 volt level or as a programmable read-only memory (PROM) cell, used for reading repeatedly information which has been permanently stored by virtue of the electrically induced and programmed threshold voltage imbalance. In other words, the underlying circuit of FIG. 2a is capable of concurrently storing information on two levels. On one level will be information permanently stored in the cell and on another level will be information stored only temporarily. Temporarily stored information can be repeatedly updated and changed without disturbing the underlying permanently stored information which is brought out by appropriately interrogating the cell.

In a typical application, a memory array comprising the underlying circuit of FIG. 2a would be used as a static RAM. When power was about to be turned off, or when power failure was being sensed, $V_{DD}$ would be momentarily raised to +20 volts, causing all the information in the array to be permanently stored in the form of changed threshold voltages in the $Q_2$ and $Q_4$ FATMOS transistors. Subsequently, when the power is restored, information last written into the RAM would appear in inverted or complementary form at each cell of the array.

The underlying FIG. 2a circuit is characterized by the fact that it is the drivers $Q_2$ and $Q_4$ which have variable thresholds. It will be seen upon reflection that the advantages just described with reference to that circuit will also flow from an alternative thereof shown in the underlying circuit of FIG. 2b, (comprising all of FIG. 2b except IGFETs $Q_A$ and $Q_B$) in which it is the loads $Q_1$ and $Q_3$ which are made with variable threshold voltages.

Figure 4A:
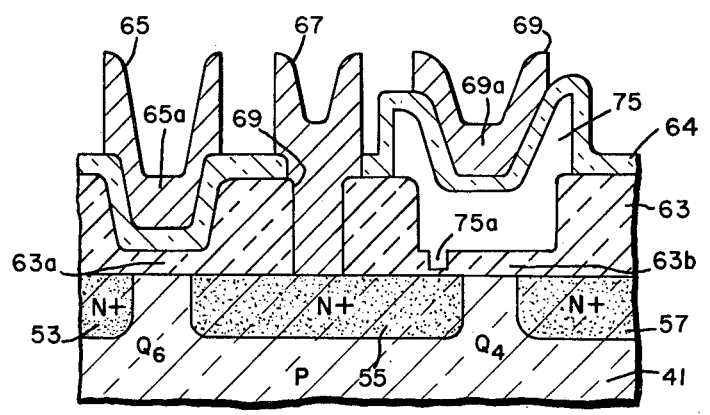

A better appreciation for the physical configuration of the underlying FIG. 2a circuit will be gained by referring to FIGS. 4 and 4a which represent an actual circuit formed in an N-type silicon substrate 39. The drawings are to scale, but magnified many times. Formed in an N-type silicon substrate 41 is a P well, formed conventionally by counter doping the N-type substrate 39. The line 43 marks one edge of the P well and is bracketed, as seen in FIG. 4, by a P+ type guard band 45, whose own borders are designated by the lines 45a and 45b. Additional P+ regions in the N-type substrate 39 include the strip 47, which is seen to form a border at the top of FIG. 4, and the two interfacing L-shaped areas 49 and 51.

Located within the P well 41 are N+ regions 53, 55, 57, 59 and 61. Covering the substrate surface, over both the N and P regions thereof, is a layer of thick oxide 63, which is thinned over the channel regions of each of the transistors Q through $Q_6$, as shown by areas 63a and 63b of FIG. 4a. The channel area of each transistor is shown by a dashed rectangle, which surrounds the symbol (e.g., $Q_4$) of that transistor in FIG. 4. An optional nitride layer 64 overlies the oxide layer 63.

Extending over the oxide layer 63 are three metal strips 65, 67 and 69. They dip close to the surface of the substrate 41 where the oxide 63 is thinned, as at 63a and 63b, and in these areas the metal strips form an integral part of the transistors — their control gates — two of which are represented by the metal areas 65a and 69a in FIG. 4a. In addition, the metal strips 65, 67 and 69 serve to interconnect the various transistors $Q_1$ through $Q_6$. Toward this end they extend to various ones of the doped regions which form sources and drains of these transistors, as shown in FIG. 4a by the extension of the metal strip 67 through an opening 69 in the oxide layer 63 to contact the N+ region 55. Completing the NOVRAM latch of FIGS. 4 and 4a are a pair of doped polysilicon floating gates 73 and 75, having small protuberances 73a and 75a where the gates dip toward the surface of the substrate, to create a tunneling region, as best seen in FIG. 4a.

It will be understood, of course, that the particular integrated circuit implementation which has been described in detail with reference to FIGS. 4 and 4a is simply one of many which could be used to put the present invention into practice.

Having discussed in some detail the various features and advantages of the underlying FIG. 2a circuit invented by Eliyahou Harari, there will next be described the improvement constituting the present invention and achieved in the circuit illustrated in FIG. 2a by the addition of the IGFETs $Q_A$ and $Q_B$, which are connected in parallel with the FATMOS transistors $Q_2$ and $Q_4$, respectively. As explained before, during normal operation of the underlying FIG. 2a circuit, information residing in the circuit may be permanently stored therein by raising its $V_{DD}$ supply voltage from its normal 5 or 10 volt level to approximately 20 volts for 10 microseconds. This elevation of the $V_{DD}$ voltage will shift the threshold voltages of the FATMOS transistors $Q_2$ and $Q_4$ by about 2 volts, although as noted previously, a $V_t$ difference might preferably be as small as 1 volt. Assuming that a 2 volt threshold shift has taken place and that both FATMOS devices $Q_2$ and $Q_4$ had an initial threshold level of 1 volt, their threshold levels will now be +3 volts and −1 volts. With these new threshold levels the latch will still function in a volatile mode, since the $V_{DD}$ operating voltage of +5 or +10 volts will be greater than that of the higher of the two FATMOS threshold voltages, insuring that a conduction path can always exist through both $Q_4$ and $Q_2$. Consequently, as explained previously with such a threshold shift for non-volatile storage information, it will still be possible to operate the NOVRAM latch of the underlying FIG. 2a circuit in a volatile mode while retaining therein, for permanent storage, the information read into the circuit in a non-volatile mode by shifting the thresholds of its FATMOS devices $Q_2$ and $Q_4$.

While the constraint of +20 volts for 10 microseconds imposed on the $V_{DD}$ supply voltage for non-volatile writing operation can be obtained by proper controls, it may be objectionable to some users of the latch. Assume, for example that, just before power is about to be lost on the NOVRAM latch of FIG. 2a, and that a non-volatile write operation is carried out by raising $V_{DD}$ to +22 volts for 15 microseconds, resulting in a shift in the FATMOS threshold voltages of 5 volts. This will cause the threshold of one of the FATMOS devices $Q_2$ and $Q_4$ to rise to +6 volts and the other one to drop to −4 volts. If it is further assumed that the normal level of $V_{DD}$ is +5 volts, it will be seen that the latch will be incapable of functioning in the volatile mode when power is returned at the normal +5 volt level to the $V_{DD}$ line, since a current path can no longer exist through that one of the FATMOS devices $Q_2$ and $Q_4$ whose threshold was raised to +6 volts. This is so because the highest available voltage on its control gate will be $V_{DD}$, or +5 volts, which is less than the new +6 volts threshold of the device. Consequently, when power is returned to the latch after power shut down, it will be locked into the state in which it was placed by the non-volatile writing operation which preceded the loss of power.

The above problem is solved in accordance with the present invention by the addition of the fixed threshold bypass IGFETs $Q_A$ and $Q_B$, since a conduction path is provided around the irreversibly turned-off FATMOS device due to the fact that the bypass IGFET has a fixed threshold which is less than that of the normal operating level of $V_{DD}$ at all times.

With the underlying circuit of FIG. 2a improved by the addition of IGFETs $Q_A$ and $Q_B$ in accordance with the present invention, it is possible to relax the limits which must be imposed on the size and duration of $V_{DD}$ during a non-volatile writing operation, and this without sacrificing the ability of the latch to continue operating in the volatile mode after receiving information in non-volatile form.

In the following paragraphs there will be described a number of different modifications of the circuit illustrated in FIG. 2a. It should be understood that these modifications came about as a result of various improvements first made by Eliyahou Harari in his basic NOVRAM latch described herein as "the underlying FIG. 2a circuit." These improvements are all described and claimed in the above-referenced Harari application and are described herein simply to illustrate the manner in which the present invention may be combined with them.

Figure 6:
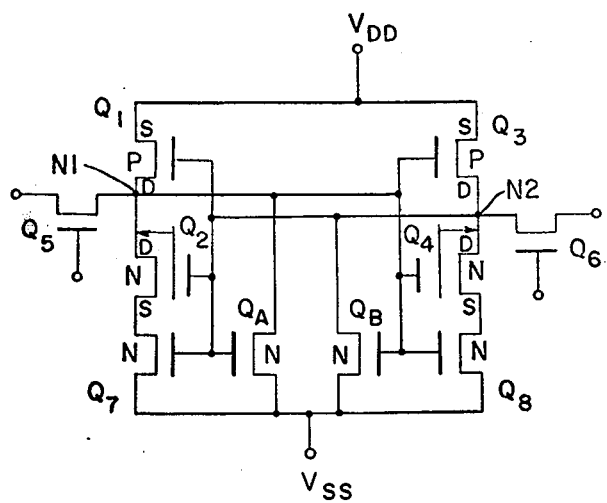
FIG. 6 is a circuit diagram of a NOVRAM circuit similar to that illustrated in FIG. 2a but with the addition of an IGFET in series with the FATMOS transistor in each branch to limit the current in that branch.
Figure 7:
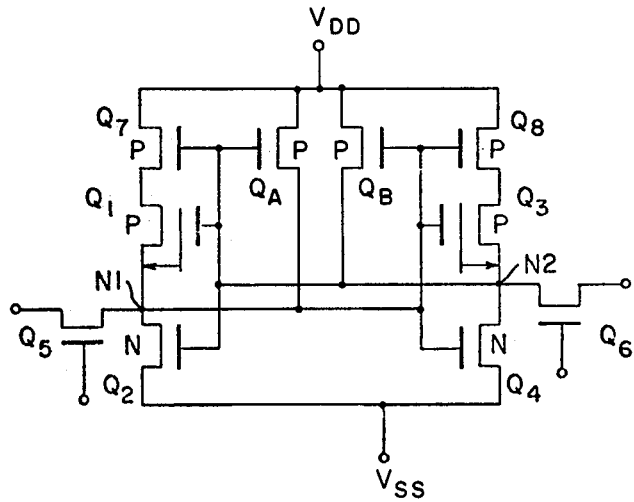
FIG. 7 is a schematic diagram of another NOVRAM embodiment similar to that of FIG. 2b but with an IGFET added to each of the FATMOS transistor loads of that circuit.

A first modification of the two basic NOVRAM latch circuits illustrated in FIGS. 2a and 2b will next be described with reference to FIGS. 6 and 7. FIG. 6 illustrates the NOVRAM latch circuit which is like that of FIG. 2a, but which has been improved over the FIG. 2a circuit by the addition, in each branch of the circuit, of an IGFET having its source-to-drain circuit connected in series with the source-to-drain circuit of the IGFET driver of that branch and its gate connected to the control gate of the IGFET driver of that branch. Thus, the additional IGFETs $Q_7$ and $Q_8$ have their source-to-drain circuits connected in series with the source-to-drain circuits of respective ones of the FATMOS transistors $Q_2$ and $Q_4$, with the gate of $Q_7$ being connected to the control gate of $Q_2$ and the gate of $Q_8$ being connected to the control gate of $Q_4$. A similar improvement over the FIG. 2b NOVRAM latch is illustrated in FIG. 7 by the addition of IGFETs $Q_7$ and $Q_8$, each having its source-to-drain circuit connected in series with that of a respective one of the FATMOS loads $Q_1$ and $Q_3$. Whereas in the FIG. 6 circuit the additional IGFETs $Q_8$ and $Q_7$, being located between the nodes $N_1$ and $N_2$ and $V_{SS}$, participate in the switching function, in the FIG. 7 circuit each forms part of the load in one of the two branches of the circuit. The improvements effected by the addition of $Q_7$ and $Q_8$ serve to reduce the current drawn by the NOVRAM latch during both volatile and non-volatile operation. These improvements were first conceived by E. Harari and are not claimed per se herein.

The shunt IGFETs $Q_A$ and $Q_B$ which are incorporated in the FIG. 6 and FIG. 7 circuits in accordance with the present invention perform their functions in the same manner as explained previously with reference to FIGS. 2a and 2b. Mention should be made, however, of one design consideration which arises as a result of the presence of the additional series IGFETs $Q_7$ and $Q_8$ in those circuits. In order to insure that the presence of the shunt IGFETs $Q_A$ and $Q_B$ does not interfere with the non-volatile storage capability of the latch, their thresholds should be made higher than those of the fixed threshold series IGFETs $Q_7$ and $Q_8$. Consequently, when power is restored after a non-volatile write operation and a subsequent power loss, and one of the branches of the NOVRAM latch is made nonconductive, the shunt IGFET of that branch will not interfere with the turning on of the other NOVRAM branch. This is so because the series fixed-threshold IGFET of the branch which is to conduct will turn on before the shunt fixed-threshold IGFET of the high threshold branch has had a chance of doing so. If this relationship between the thresholds of the fixed threshold shunt and series IGFETs is not observed, so that the threshold of the shunt IGFET is lower than that of the series IGFET, the shunt IGFET will turn on after a non-volatile write operation, bypassing its associated FATMOS device and pulling the gate of the series fixed-threshold IGFET associated with the other branch to ground, thus preventing it from turning on, thereby rendering the branch containing it nonconductive. This, would of course, vitiate the non-volatile writing operation whose object is to render nonconductive that branch whose FATMOS device has had its threshold voltage raised.

A problem found in one NOVRAM cell constructed in accordance with FIG. 6 is that the internal nodes of the latch ($N_1$ and $N_2$) do not completely discharge when the power is removed. As a result, when power is reapplied, there is a bias existing in the cell which can cause an incorrect "power-up" condition; i.e., the cell will initialize to a state not predicted by the state of the FATMOS devices.

One possible solution to this problem is to make the thresholds of the parallel device $Q_A$ and $Q_B$ such that the residual bias on nodes $N_1$ and $N_2$ will not cause these devices to conduct before the branches with the FATMOS and series n device $Q_2$, $Q_7$ and $Q_4$, $Q_8$ conduct. In these particular NOVRAM latch circuits it has been found that a .7 volt difference between the thresholds of $Q_A$, $Q_B$ on the one hand and $Q_7$, $Q_8$, on the other, solves the above problem.

The improvement which is illustrated in FIGS. 6 and 7 can be implemented not only in CMOS technology but also in NOVRAM latches using all N-channel or all P-channel technology. With CMOS technology, which is that illustrated in FIGS. 6 and 7, the load transistors (those above the nodes $N_1$ and $N_2$) are P-channel and the drivers (those transistors below the nodes $N_1$ and $N_2$) are N-channel devices. Where purely N-channel or P-channel technology is used (such as the circuits illustrated in FIGS. 8, 9 and 10), the variable threshold transistors will always be the drivers.

Figure 8:
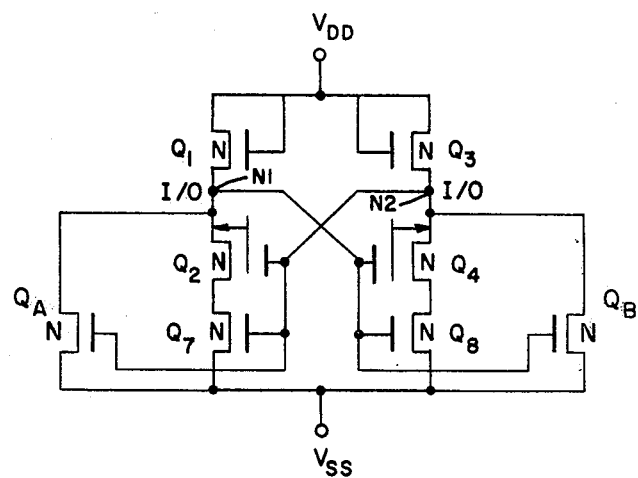
FIG. 8 is a schematic diagram of a NOVRAM in accordance with the present invention made exclusively with N-channel devices, in contrast to the circuits illustrated in FIGS. 2a, 2b, 6 and 7, in which CMOS technology was used.
Figure 9:
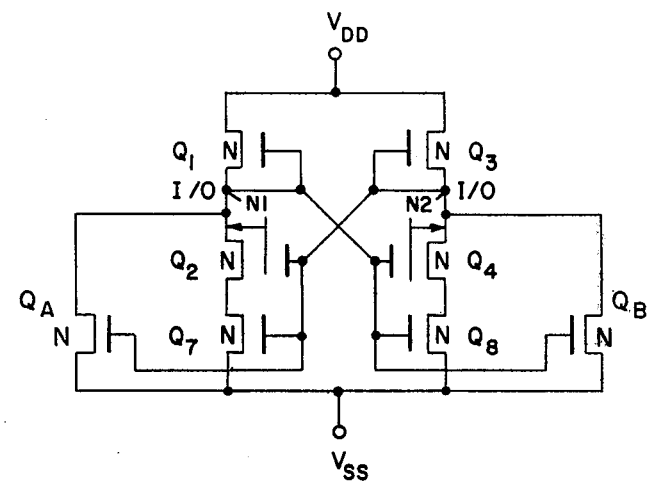
FIG. 9 is a schematic diagram of yet another NOVRAM latch incorporating features of the present invention and using N-channel technology.
Figure 10:
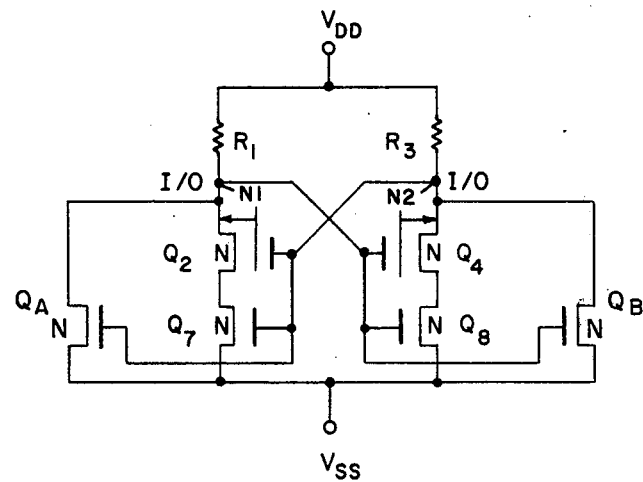
FIG. 10 is a third N-channel implementation of a NOVRAM latch in accordance with the present invention wherein both of the load devices are resistors rather than IGFETs.

Three examples of NOVRAM latch circuits using FATMOS transistors as the variable threshold voltage transistors and using an all N-channel circuit are illustrated in FIGS. 8, 9 and 10. It might be noted at this point that the Bit line transistors $Q_5$ and $Q_6$, shown with the basic NOVRAM latch circuits of FIGS. 2a and 2b, and also in the CMOS implementation of the improved NOVRAM latch circuit illustrated in FIGS. 6 and 7, have been omitted for sake of simplicity from the all N-channel implementations illustrated in FIGS. 8, 9 and 10. It should be understood that such input transistors as $Q_5$ and $Q_6$ are simply one possible means for writing into and reading from the NOVRAM latch.

The first of the all N-channel NOVRAM latch circuits, illustrated in FIG. 8, is characterized by the fact that its load transistors $Q_1$ and $Q_3$ are biased into conduction at all times since their gates are connected to the $V_{DD}$ line. However, the extent to which the load transistors $Q_1$ and $Q_3$ are turned on is much less than that to which the drivers ($Q_2$ and $Q_7$ in one branch and $Q_4$ and $Q_8$ in the other branch) are turned on. Thus, each branch functions as a voltage divider in which, when the drivers are turned on, their impedance is much less than that of the loads, so that the I/O node $N_1$ or $N_2$ will be essentially at $V_{SS}$. Conversely, when the drivers in a particular branch are turned off, their combined impedance becomes much greater than that of the load in that branch, so that the I/O node of that branch rises to practically $V_{DD}$. In short, in each branch the I/O node swings essentially between $V_{DD}$ and $V_{SS}$ as the drivers of that branch are turned off and on respectively.

While the all N-channel circuit of FIG. 8 is simpler than the CMOS circuit of FIG. 6, it draws considerably more power, due to a continuous current drain through it. The NOVRAM latch of FIG. 9 is identical to that of FIG. 8, except for two differences. First, the IGFET loads $Q_1$ and $Q_3$ of FIG. 9 are depletion type transistors, and its IGFET drivers are of the enhancement type. Secondly, the gates of the IGFET loads $Q_1$ and $Q_3$ are connected to their sources, rather than to their drains as was the case with the FIG. 8 circuit. The load transistors $Q_1$ and $Q_3$ are selected to be depletion type devices, since their gate-to-source voltage is zero, which requires that their characteristics be such that, at the zero gate-to-source voltage, they be rendered constantly conducting. Typical thresholds for such devices are between $-0.5$ and $-3$ volts. This latch, incidentally, is similar in concept to that discussed previously with reference to FIG. 1a, and may be considered to be an improvement thereon by the addition of a variable threshold transistor in series with each of the IGFET drivers $Q_2$ and $Q_4$ of FIG. 1a.

Yet another alternative to the circuits of FIGS. 8 and 9 is to simply use an integrated resistor in place of each of the IGFETs $Q_1$ and $Q_3$ as the load for the NOVRAM latch, and this is illustrated in FIG. 10. A doped polycrystalline strip may, for example, be used to integrate the resistors $R_1$ and $R_3$ with the remaining components of the latch.

There was previously described in some detail, with reference to FIGS. 4 and 4a, one way in which the underlying CMOS NOVRAM latch of FIG. 2a might be implemented. It would be relatively simple to modify that circuit so as to add the additional IGFETs, such as $Q_7$ and $Q_8$ of FIG. 6, to that integrated circuit. Indeed, three different approaches are illustrated in FIGS. 11, 11a, 12, 12a, 13 and 13a. Each of them illustrates two of the eight transistors of the FIG. 6 circuit: The FATMOS $Q_2$ and the fixed threshold IGFET $Q_7$. The FATMOS $Q_2$ includes the same basic elements as were shown to form parts of the exemplary FATMOS transistor illustrated in FIGS. 3 and 3a. For ease of comparison, therefore, these elements are identified by the same reference numerals as were used for them in FIGS. 3 and 3a, except for the addition of the suffixes "a", "b", and "c" in FIGS. 11, 11a, 12, 12a, 13 and 13a, respectively. Thus, for example, in the circuits illustrated in FIGS. 11 and 11a, there are formed in a P-type silicon substrate region 21a a pair of source and drain regions 23a and 25a, which are separated by a channel region identified as $Q_2$. Supported above the channel region of $Q_2$ in an oxide layer 26a is a floating gate 33a having a small area 35a where it is very closely spaced from the surface of the drain region 25a. Overlying the floating gate 33 on the surface of the oxide 26a is a control gate 31a.

Figure 11:
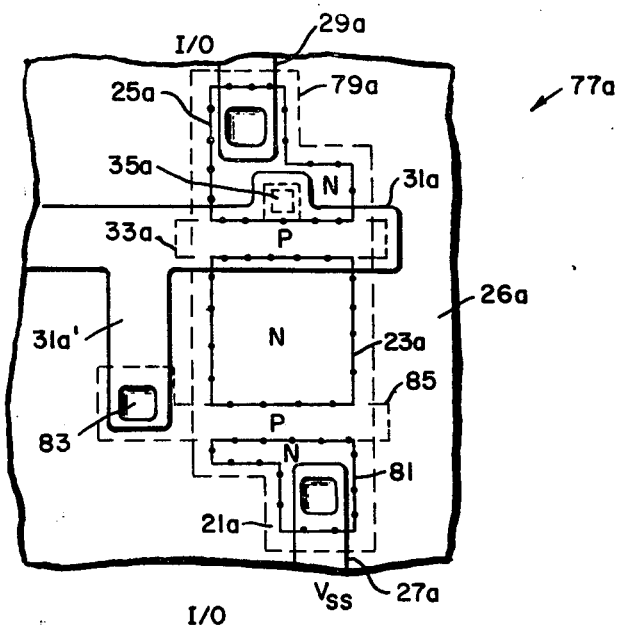
FIGS. 11, 11a, 12, 12a, 13 and 13a illustrate in plan and schematic cross-sectional views, three alternative ways for implementing the addition of an IGFET in series with a FATMOS transistor.
Figure 11A:
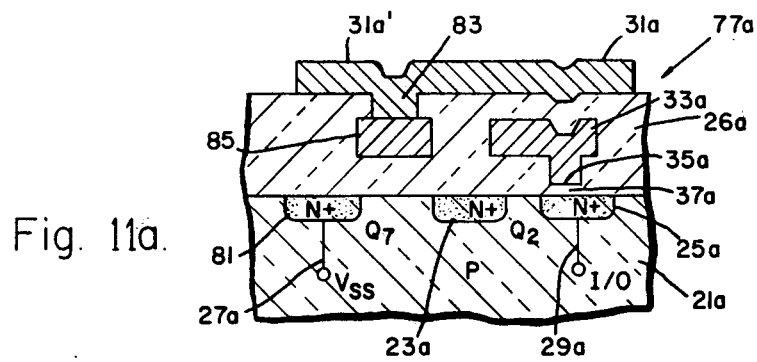

A point which is not apparent in FIG. 11a but which is shown in FIG. 11 is that the P-type region 21a is actually a part of a P-well 79a, which is formed to an N-type substrate totally surrounding that well.

To form the additional IGFET whose source-to-drain circuit will be in series with that of the FATMOS $Q_2$, an additional N+ diffusion 81 is formed at some distance from the N+ diffusion 23a which serves as the source of the FATMOS transistor $Q_2$. The P-type region between the diffusions 23a and 27a serves as the channel for the additional transistor $Q_7$, whose drain is formed by the same diffusion 23a that functions as the source of the transistor $Q_2$ and whose source is formed by the additional diffusion 81. The voltage supply $V_{SS}$ is connected to the additional diffusion 81, instead of being connected directly to the source 23a of the FATMOS transistor $Q_2$, resulting in placing the source-to-drain circuits of the two transistors $Q_7$ and $Q_2$ in series. Forming the gate of the additional IGFET Q is a polycrystalline strip 85 supported in the oxide layer 26a at the same level as the floating gate of 33a. Contact to the gate 85 of the IGFET $Q_7$ is made from the control gate 31a by an extension 31a' thereof, which makes contact with the control gate 85 of the transistor $Q_7$ through an opening 83 in the insulator 26a.

It is apparent from the foregoing brief description of the circuit illustrated in FIGS. 11 and 11a, that there is added thereby to the FATMOS $Q_2$ an additional transistor $Q_7$, whose source-to-drain circuit is in series with that of the FATMOS $Q_2$, and whose control gate is connected directly to the control gate of that transistor.

Figure 12:
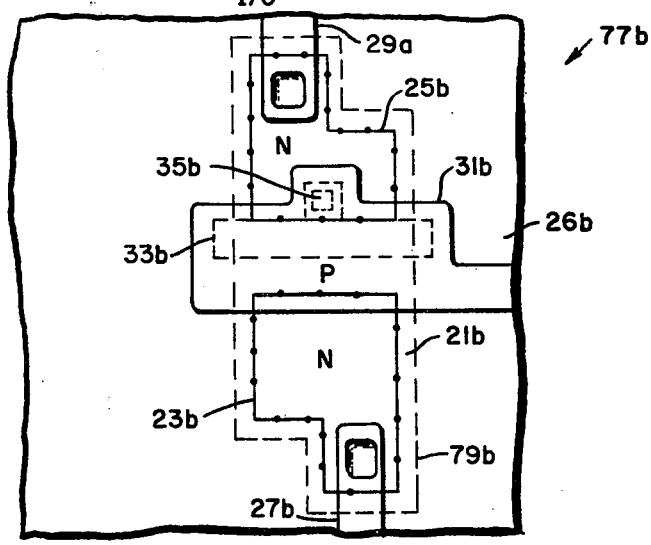
Figure 13:
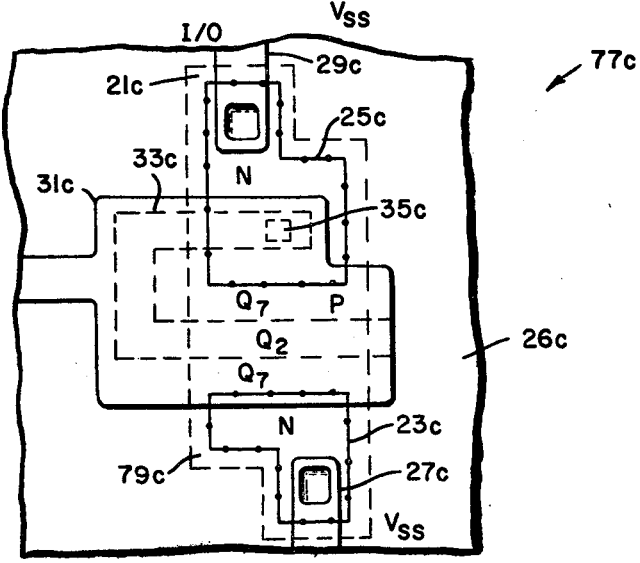
Figure 12A:
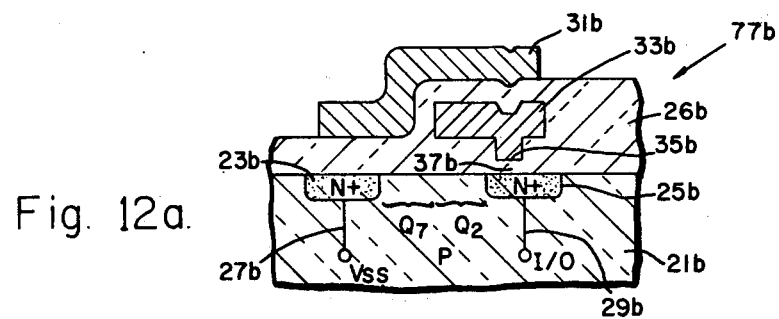
Figure 13A:
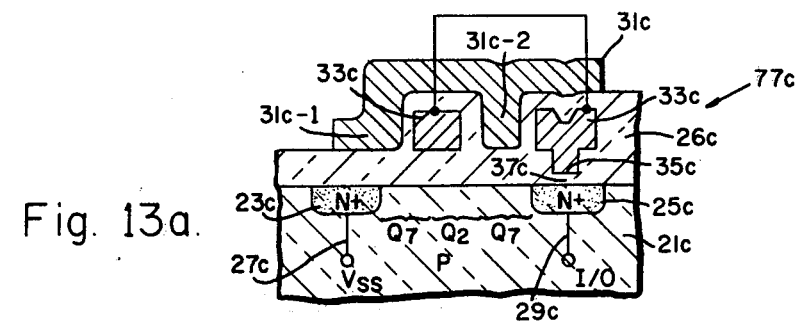

The addition of the transistor $Q_2$ in the embodiment shown in FIGS. 11 and 11a was achieved at the expense of one additional diffusion and an additional separate control gate. An alternative, whereby the additional IGFET is obtained without the addition of either, is illustrated in FIGS. 12 and 12a. This embodiment differs from the basic FATMOS shown in FIGS. 3 and 3a basically in that the channel region between the source and drain diffusions 23b and 25b serves two purposes. First, it serves as a means for modulating the impedance between the source and drain regions 23b and 25b in response to voltages on the control gate 31b and in response to charges stored permanently on the floating gate 33b in the manner described previously with reference to FIGS. 3 and 3a. Secondly, however, the same channel region also serves, in the area identified as $Q_7$, to modulate the impedance between the source and drain regions 23b and 25b in response to a voltage on the control gate 31b in a manner analogous to that of a fixed threshold IGFET since, in the region $Q_7$, the control gate 31b overlies the channel directly and is not affected by electrons stored on the floating gate 33b, which stops short of that portion of the channel. As a result, the configuration of FIGS. 12 and 12a incorporates both a fixed threshold IGFET, whose control gate is the element 31b, as well as a FATMOS whose control gate, floating gate and drain comprise the elements 31b, 33b and 25b.

A similar approach is that illustrated in FIGS. 13 and 13a, wherein again a single pair of diffusions 23c and 25c define a channel having a central portion designated as $Q_2$, and covered by one arm of a U-shaped floating polycrystalline silicon gate 33c and two edge portions, lying adjacent to the central portion, each designated as $Q_7$ and each covered by a portion of the control gate 31c. The other arm of the floating gate 33c extends over the drain diffusion 25c where it dips toward th drain to define a thin tunneling oxide area. Again, in a manner similar to that discussed with reference to FIGS. 12 and 12a, the central portion $Q_2$ of the channel functions in response to a voltage on the control gate 31c and in response charges stored on the floating gate due to tunneling from the drain 25c. At the same time, the channel regions $Q_7$ serve to modulate current flow between source and drain 23c and 25c in response to the voltage on the control gate 31c.

There are two problems encountered by the basic NOVRAM latch of the type illustrated in FIGS. 2a and 2b which are solved by the improvement just described with reference to FIGS. 6 through 13a.

The two problems inherent in the basic NOVRAM latch of FIGS. 2a and 2b occur principally during volatile and nonvolatile operation. The problem encountered during volatile operation finds its source in the non-volatile, high voltage writing operation during which the $V_{DD}$ line of the latch rises from its subthreshold-shifting level of approximately +5 volts or +10 volts to approximately +20 volts, where it remains for about 10 microseconds. During this time one of the FATMOS transistors in the latch shifts to a more positive threshold and the other to a more negative threshold. Assuming initially that they both had a threshold voltage of +0.5 volt just prior to the non-volatile writing operation, their thresholds would shift during that operation to typically +3 volts and −2 volts, respectively. The negative threshold reached by one of the FATMOS transistors will cause a significant power drain through the branch containing that transistor during the subsequent volatile operation of the latch, since that transistor will continue to conduct even with its gate at 0 volts, which is the lowest voltage its gate will ever see. The presence of an IGFET such as $Q_7$ and $Q_8$ in series with the variable threshold voltage transistor prevents this current drain, because the IGFET transistors' threshold voltage is not changed by the high voltage non-volatile write operation and will typically be about +1 volt.

The second problem of the basic NOVRAM latch, encountered during non-volatile operation, is due to the strong capacitive coupling of the floating gate 33 of the FATMOS transistor to its drain 29 through the thin tunneling oxide area 37. Its effect is to cause, during non-volatile writing operations, a small positive voltage to be applied between the floating gate and drain of that FATMOS whose threshold is being shifted to a negative level, resulting in a heavy current drain through that FATMOS during the non-volatile writing operation. Since the voltage across the control gate and drain of the other FATMOS transistor $Q_2$ is the difference between the voltages on the two nodes $N_1$ and $N_2$, the extent of the threshold voltage shift in $Q_2$ will be diminished.

This second problem is also solved by the addition of the IGFETs $Q_7$ and $Q_8$, since their threshold voltages remain at about 1.0 volts even when their associated FATMOS transistors' threshold voltages are changed.

It will be apparent upon inspection that, various all N-channel circuits, three of which are shown in FIGS. 8, 9 and 10, also benefit from the addition of IGFETs in series with their FATMOS transistors $Q_2$ and $Q_4$. Thus, all of them would, without the addition of the transistors $Q_7$ and $Q_8$, operate less effectively because of the floating gate-to-drain induced problem described previously.

Turning next to FIGS. 14 through 17, the application of the present invention to yet another modification of the previously discussed embodiments of the NOVRAM latch will be described. Each of the NOVRAM latch circuits of FIGS. 14 through 17 share the common feature invented by Eliyahou Harari, of achieving non-volatility in the NOVRAM latch with a single FATMOS transistor instead of two. This in turn yields two major advantages. The first advantage derives from the fact that the thin oxide used for tunneling of charge onto the floating gate of a FATMOS is a major yield-reducing factor, particularly in very large memory arrays where a single pinhole in one of the thin oxide areas of array of latches is sufficient to ruin an entire chip. Use of a single FATMOS in place of two per NOVRAM latch cuts in half the total area of the thin tunneling oxide for the memory array. Secondly, FATMOS transistors require approximately twice the silicon areas used for fixed threshold transistors. Elimination of one of the two FATMOS transistors from the NOVRAM latch reduces its size, thus further increasing the yield.

The achievement of the non-volatility function with a single FATMOS transistor does not require better control of the manufacturing process. This is apparent when one considers that, in the basic NOVRAM cell of FIG. 2a, non-volatile write operation causes the threshold voltage of one of the FATMOS transistors ($Q_2$) to rise while dropping the threshold voltage of the other FATMOS transistor ($Q_4$) by an equal amount. Thus, in the basic NOVRAM latch of FIG. 2a (and the same comments also apply to FIG. 2b) what really matters is the relative difference in the thresholds in the variable threshold transistors $Q_2$ and $Q_4$. Their absolute threshold voltages, which are a function of processing parameters, are not critical. In the improved NOVRAM latch as illustrated in FIGS. 15 through 18, on the other hand, one of the previously variable threshold transistors ($Q_4$) has a fixed threshold and therefore non-volatile write operation in such a latch requires that the variable threshold FATMOS transistor $Q_2$ have its threshold voltage brought to a level either above or below that of $Q_4$. Thus, the absolute value of the threshold voltage of the single FATMOS transistor becomes important and requires tighter processing control as well as tighter control on the magnitude of the high voltage write pulse.

Figure 16:
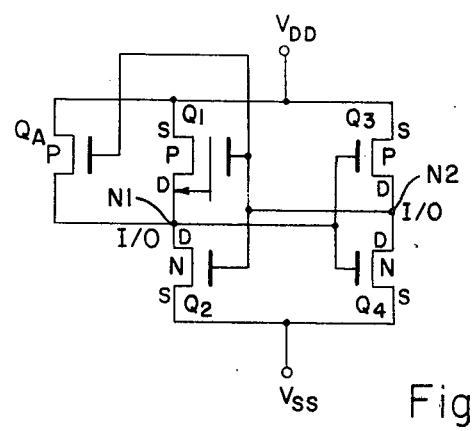
FIG. 16 is a schematic diagram of a NOVRAM latch which is similar to that illustrated in FIG. 2b but is an improvement thereon in that only one of the IGFET loads has a variable threshold voltage.

In a manner analogous to that described for FIG. 14, the other basic NOVRAM latch circuit of FIG. 2b can be modified so as to use only a single FATMOS as illustrated in FIG. 16.

To achieve the objectives of the present invention, only a single shunt IGFET $Q_A$ need be added to the underlying NOVRAM circuits of FIGS. 14 and 16 since they each include only a single FATMOS, across which $Q_A$ is connected. In the circuits of FIGS. 14 and 16, the absolute value of the threshold voltage of $Q_A$ should be greater than that of $Q_4$ and $Q_3$ respectively.

Figure 15:
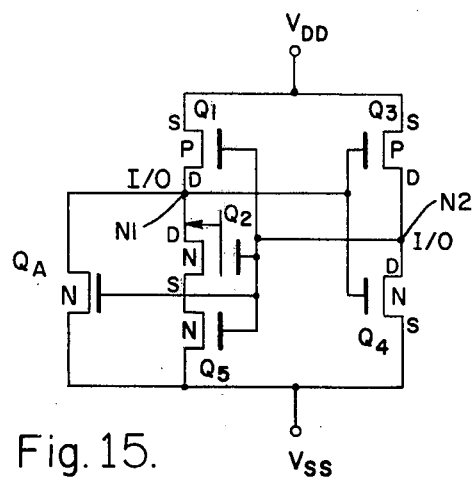
FIG. 15 is a schematic diagram of a latch circuit basically like that illustrated in FIG. 14 but further improved by the addition of an IGFET transistor in series with the single variable threshold voltage transistor of that circuit to limit current in the branch containing that transistor.
Figure 17:
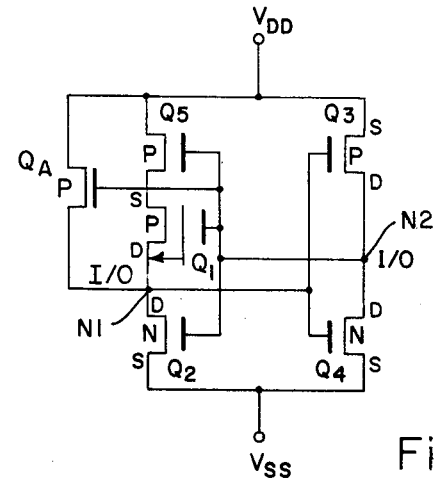
FIG. 17 is a schematic diagram of a NOVRAM latch which incorporates the improvement of the circuit illustrated in FIG. 16 in that it has only a single variable threshold voltage (shown as a FATMOS) transistor load but is a further improvement thereon by incorporating an additional IGFET transistor in series with the FATMOS load transistor to limit current in the branch containing that transistor.

Both of the improved circuits of FIGS. 14 and 16 are amenable to improvement by the addition of an IGFET transistor with a fixed threshold voltage in series with their single FATMOS transistor, in a manner analogous to that described previously with reference to the NOVRAM latch circuits of FIGS. 6 and 7. The advantages of adding a fixed threshold IGFET in series with a variable threshold FATMOS transistor will be similar to those described previously with reference to FIGS. 6 and 7. One caution that needs to be observed for the additional fixed threshold transistor identified as $Q_5$ in both FIGS. 15 and 17, is that (with particular reference now to FIG. 15) the threshold voltage of $Q_4$ must be at least approximately 0.5 volt higher than that of $Q_5$. Otherwise, if the threshold voltages of $Q_4$ and $Q_5$ were less than 0.5 volt apart, the latch would rise after a non-volatile write operation in an ambiguous state if the non-volatile writing operation had resulted in placing $Q_2$ in its low threshold voltage (conducting) state. The reason for this is that, when the FATMOS transistor $Q_2$ conducts, its impedance is negligible. Therefore, the state which the latch will assume under that condition will be determined by the relative impedances of $Q_4$ and $Q_5$. If their impedances were approximately the same, because they had the same threshold voltages, the state of the latch would be ambiguous.

By selecting the threshold voltage of $Q_4$ so as to be slightly (say 0.5 volt) higher than that of $Q_5$, the latch will be consistently switched to one state or the other, depending solely upon the threshold voltage level of the FATMOS transistor $Q_2$.

The same parameters and advantages also apply to the circuit of FIG. 17 which is an improvement over that of FIG. 16, in that the FIG. 17 circuit includes the additional IGFET transistor $Q_5$ in series with the variable FATMOS transistor $Q_1$. For the same reason as just explained with reference to FIG. 15, the threshold voltage of $Q_3$ should be at least 0.5 volt higher than that of $Q_5$.

The objectives of the present invention are attained in the FIGS. 15 and 17 circuits by adding a single fixed threshold shunt IGFET $Q_A$ across each FATMOS and its associated current limiting series IGFET $Q_5$. The absolute value of its threshold voltage should be lower than $V_{DD}$ at its normal level and higher than those of $Q_4$ and $Q_3$ in FIGS. 15 and 17 respectively. Suitable threshold values for $Q_4$, $Q_5$ and $Q_A$ would be +1.3 volts, +1.0 volts, and +2.5 volts respectively. In order to ensure that the problem discussed with reference to FIG. 6 does not occur, the threshold value for $Q_4$ should be raised to 2.0 volts.

The last to be described variation of the NOVRAM latch is that illustrated schematically in FIGS. 18 and 20, with plan and cross-sectional views of an integrated circuit implementation appearing in FIGS. 19 and 19a. Referring first to FIG. 18, it is essentially an improvement over the single-FATMOS NOVRAM latch of FIG. 14. Assume that, in the previously discussed latch of FIG. 14, $Q_4$ rather than $Q_2$ is the single FATMOS transistor, which is an equivalent alternative to that shown in FIG. 14. The circuit of FIG. 18 differs from that assumed single-FATMOS latch by sharing its floating gate with its associated IGFET $Q_3$. The resulting circuit, shown in FIG. 18, enjoys the advantages of the FIG. 14 circuit (and its equivalent) which derive from the fact that the FIG. 18 circuit has only a single tunneling oxide area. Yet, it is superior to the FIG. 14 (and its equivalent) circuit because both of the transistors $Q_3$ and $Q_4$ in its right-hand branch have variable thresholds whose shifts, in response to a given non-volatile writing pulse, will reinforce each other, because of their opposite conductivity types.

Before going into detail as to the manner in which the FIG. 18 improved NOVRAM latch operates, the manner in which the transistors $Q_3$ and $Q_4$ might be fabricated will be explained with reference to FIGS. 19 and 19a. Consistent with the implementation of the basic circuit as illustrated in FIGS. 4 and 4a, the transistors $Q_3$ and $Q_4$ are seen formed in an N-type substrate 91, in which there has been formed a P well 93. A P+ doped guard band 95 is formed in the substrate surface at the P/N junction formed by periphery of the P well 93 and substrate 91. N+ source and drain regions 97 and 99 formed in the P well 93 define the N channel transistor $Q_4$ and P+ source and drain regions 101 and 103 in the N substrate 91 define the P channel of the transistor $Q_3$. Covering the surface of the substrate 91 is an insulating layer 105 (oxide/nitride or nitride being preferred, but all oxide also being acceptable) which is thinned over the doped regions 97 and 103 to facilitate the making of contacts 107 and 109 thereto through openings in the oxide. The contact 107 serves to bring the $V_{SS}$ line to the source 97 of $Q_4$, and the contact 109 serves to bring the $V_{DD}$ line to the source of $Q_3$. Buried in the insulating layer 105 is a floating gate 111, having two legs 111a and 111b extending from a common trunk to a position between the N+ regions 97, 99 and the P+ regions 101, 103, respectively. The first branch 111a of the floating gate is provided with a small "spot" where it extends vertically down toward the substrate 91. This spot is located preferably over the drain diffusion 99 of the transistor $Q_4$.

Disposed on the surface of the insulating layer 105 is a control gate 115, which extends generally above the floating gate 111 and which also has two arms 115a and 115b, also extending from a common trunk, and serving as the control gates for the transistors $Q_4$ and $Q_3$, respectively. Completing the construction of the transistors $Q_3$ and $Q_4$ is a metal strip 118 which extends at its opposite ends through contacts 117 and 119 to respective ones of the $Q_4$ and $Q_3$ drain diffusion 99 and 101. The metal strip 118 thus interconnects the transistors $Q_3$ and $Q_4$ at their drains, thus forming the I/O node $N_2$ of their branch. The strip 118 is provided with an extension 118a which serves to connect the I/O node to the gates of the transistors $Q_1$ and $Q_2$ (not shown in FIGS. 19 and 19a).

Inspection of FIGS. 19 and 19a reveals a pair of opposite conductivity type IGFETS compactly arrayed and sharing a single floating gate as well as a single control gate, with the floating gate having only a single tunneling oxide area, defined by the extension 113 of that gate. So long as normal (subthreshold shifting) voltage levels are applied to the circuit between $V_{SS}$ and $V_{DD}$, the two transistors $Q_3$ and $Q_4$ operate as a CMOS inverter. When the voltage $V_{DD} - V_{SS}$ is raised to approximately +20 volts, however, tunneling occurs through the thin tunneling oxide area over the $Q_4$ drain 99, causing charges to accumulate on the floating gate 111. This has the same physical effect on the channel areas of both transistors $Q_3$ and $Q_4$. In both of these channel areas there will be fewer electrons than there would be in the absence of electrons on the floating gate, due to the repelling effect of electrons on the floating gate on electrons in the channel regions of the transistors $Q_3$ and $Q_4$. However, because the transistors $Q_3$ and $Q_4$ have opposite conductivity types, this electron deficit will have opposite effects on their operation. The threshold of $Q_3$ will be reduced (rendering it more conductive) while that of $Q_4$ will be increased (rendering it less conductive) by roughly equal amounts.

To achieve the advantages of the present invention with the circuit of FIG. 18, fixed threshold IGFETS $Q_A$ and $Q_B$ are connected across $Q_3$ and $Q_4$ respectively. The absolute values of the threshold voltages of $Q_A$ and $Q_B$ should be greater than those of $Q_1$ and $Q_2$ respectively. Appropriate threshold values for $Q_1$, $Q_2$, $Q_A$ and $Q_B$ would be −1.0v, +1.0v, −2.5v, and +2.5v respectively.

Since the improved NOVRAM latch of FIG. 18 may still be subject to the drawback of excessive drain current and diminished operating effectiveness if either of the transistors $Q_3$ or $Q_4$ has had its threshold voltage shifted so that it conducts even when the voltage on its control gate is 0 (depletion mode conduction), the addition of an IGFET in series with each of the transistors $Q_3$ and $Q_4$ will yield the same benefits as those described previously, in particular with reference to FIGS. 6 and 7. Such a modification is shown in FIG. 20 which is identical to the circuit of FIG. 18, except that a P channel transistor $Q_5$ has been connected with its source-to-drain circuit in series with that of the P channel load transistor $Q_3$ and an additional N channel IGFET $Q_6$ has been added with its source-to-drain circuit in series with that of the driver transistor $Q_4$. The additional transistors $Q_5$ and $Q_6$ should have the same thresholds as $Q_1$ and $Q_2$, respectively and with such thresholds they will be effective in preventing power drain from $V_{DD}$ to $V_{SS}$ which might otherwise occur during those times when either $Q_3$ or $Q_4$ has had its threshold shifted so as to cause the transistor to operate in the depletion mode.

To implement the present invention in the circuit of FIG. 20, fixed threshold IGFET $Q_A$ is connected across $Q_3$ and $Q_5$, and a second fixed threshold IGFET $Q_B$ is connected across $Q_4$ and $Q_6$. The absolute values of the threshold voltages of $Q_A$ and $Q_B$ should be greater than those of $Q_1$ and $Q_2$ respectively.

From the foregoing, it will be apparent that the present invention represents a significant improvement over the various embodiments of the Harari NOVRAM latch circuit disclosed and claimed in the above-identified Harari patent application by permitting such circuits to continue to operate in the volatile storage mode even after their FATMOS devices have been rendered irreversibly non-conductive by a non-volatile writing operation.

What is claimed is:

1. In combination with an integrated semiconductor memory latch circuit having:
   (a) a pair of branches, each branch including an IGFET load and an IGFET driver connected in series drain-to-drain at a node, the control gate of the IGFET driver of each branch being connected to the node of the other branch, said IGFET drivers having electrically variable thresholds;
   (b) means for normally maintaining a first voltage across said pair of branches which is below that required to change the threshold of said IGFET drivers;
   (c) means for turning on a selected one of said IGFET drivers so as to store information in said latch circuit in volatile form; and
   (d) means for temporarily raising the voltage across said pair of branches to a second, higher level which is sufficient to cause opposite long term threshold shifts in said IGFET drivers, said drivers being subject to being permanently cut off as a result of said voltage being raised beyond said second level;

the improvement comprising a pair of fixed threshold shunt IGFETs, each connected so as to bypass a respective one of said driver IGFETs having an electrically variable threshold, so that, when one of said drivers is cut off, the shunt IGFET which bypasses it will continue to carry sufficient current to replace that normally conducted by the cut off driver.

2. In combination with an integrated semiconductor memory latch circuit having:
   (a) a pair of branches, each branch including an IGFET load and an IGFET driver connected in series drain-to-drain at a node, the control gate of the IGFET load of each branch being connected to the node of the other branch, said IGFET loads having electrically variable thresholds;
   (b) means for normally maintaining a first voltage across said pair of branches which is below that required to change the threshold of said IGFET loads;
   (c) means for turning on a selected one of said IGFET loads so as to store information in said latch circuit in volatile form; and
   (d) means for temporarily raising the voltage across said pair of branches to a second, higher level which is sufficient to cause opposite long term threshold shifts in said IGFET loads said loads being subject to being permanently cut off as a result of said voltage being raised beyond said second level;

the improvement comprising a pair of fixed threshold shunt IGFETs, each connected so as to bypass a respective one of said load IGFETs having an electrically variable threshold so that, when one of said loads is cut off, the shunt IGFET which bypasses it will continue to carry sufficient current to replace that normally conducted by the cut off load.

3. In combination with an integrated semiconductor memory latch circuit having:
   (a) a pair of branches, each branch including an IGFET load and an IGFET driver connected in series drain-to-drain at a node, a fixed threshold series IGFET having its source-to-drain circuit connected in series with the source-to-drain circuit of the IGFET driver in said branch, the control gate of the IGFET driver of each branch being connected to the control gate of the IGFET connected in series therewith and also to the node of the other branch, said IGFET drivers having electrically variable thresholds;
   (b) means for normally maintaining a first voltage across said pair of branches which is below that required to change the threshold of said IGFET drivers;
   (c) means for turning on a selected one of said IGFET drivers so as to store information in said latch circuit in volatile form; and
   (d) means for temporarily raising the voltage across said pair of branches to a second, higher level which is sufficient to cause opposite long term threshold shifts in said IGFET drivers, said drivers being subject to being permanently cut off as a result of said voltage being raised beyond said second level;

the improvement characterized by a pair of fixed threshold shunt IGFETs, each connected so as to bypass a respective one of said IGFET drivers, the thresholds of said fixed threshold shunt IGFETs being higher than those of said fixed threshold series IGFETs, and lower than said first voltage so that, when one of said drivers is cut off, the shunt IGFET which bypasses it will continue to carry sufficient current to replace that normally conducted by the cut off driver.

4. In combination with an integrated semiconductor memory latch circuit having:
(a) a pair of branches, each branch including an IGFET load and an IGFET driver connected in series drain-to-drain at a node, a fixed threshold series IGFET having its source-to-drain circuit connected in series with the source-to-drain circuit of the IGFET load in said branch the control gate of the IGFET load of each branch being connected to the control gate of the IGFET connected in series therewith and also to the node of the other branch, said IGFET loads having electrically variable thresholds;
(b) means for normally maintaining a first voltage across said pair of branches which is below that required to change the threshold of said IGFET loads;
(c) means for turning on a selected one of said IGFET loads so as to store information in said latch circuit in volatile form; and
(d) means for temporarily raising the voltage across said pair of branches to a second, higher level which is sufficient to cause opposite long term threshold shifts in said IGFET loads said loads being subject to being permanently cut off as a result of said voltage being raised beyond said second level;
the improvement comprising a pair of fixed threshold shunt IGFETs, each connected so as to bypass a respective one of said IGFET loads, the thresholds of said fixed threshold shunt IGFETs being higher than those of said fixed threshold series IGFETs and lower than said first voltage so that, when one of said loads is cut off the shunt IGFET which bypasses it will continue to carry sufficient current to replace that normally conducted by the cut off load.

5. In combination with an integrated semiconductor memory latch circuit having:
(a) a pair of branches, each branch including a load device and an IGFET driver connected in series at a node, the control gate of the IGFET driver of each branch being connected to the node of the other branch, at least one of said IGFET drivers having:
(1) a floating gate with a thin oxide area over the node to which said IGFET driver is connected,
(2) a control gate capacitively coupled to said floating gate, and
(3) an electrically variable threshold voltage;
(b) means for normally maintaining a first voltage across said pair of branches which is below that required to cause tunneling across the thin oxide area of said at least one IGFET driver;
(c) means for turning on a selected one of said IGFET drivers so as to store information in said latch circuit in volatile form; and
(d) means for temporarily raising the voltage across said pair of branches to a second, higher level which is sufficient to cause tunneling across said thin oxide area so as to cause a long term shift in the threshold of said at least one IGFET driver, said at least one IGFET driver being subject to being permanently cut off as a result of said voltage being raised beyond said second level;
the improvement comprising a fixed threshold IGFET connected so as to bypass said at least one of said IGFET drivers having an electrically variable threshold voltage so that, when said at least one IGFET is cut off, the shunt IGFET which bypasses it will continue to carry sufficient current to replace that normally conducted by the cut off driver.

6. The circuit of claim 5 characterized further in that the threshold of said fixed threshold IGFET is lower than said first voltage.

* * * * *